(12) United States Patent  
Pan et al.

(10) Patent No.: US 11,581,437 B2
(45) Date of Patent: Feb. 14, 2023

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Kuan-Ting Pan, Taipei (TW); Kuo-Cheng Chiang, Zhubei (TW); Pei-Yu Wang, Hsinchu (TW); Cheng-Ting Chung, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 30 days.

(21) Appl. No.: 17/199,427

(22) Filed: Mar. 11, 2021

(65) Prior Publication Data
US 2022/0293782 A1    Sep. 15, 2022

(51) Int. Cl.
*H01L 29/78* (2006.01)
*H01L 29/423* (2006.01)
*H01L 21/8234* (2006.01)
*H01L 29/66* (2006.01)

(52) U.S. Cl.
CPC .... *H01L 29/785* (2013.01); *H01L 21/823468* (2013.01); *H01L 29/4232* (2013.01); *H01L 29/66795* (2013.01); *H01L 2029/7858* (2013.01)

(58) Field of Classification Search
CPC ......... H01L 29/41791; H01L 29/66795; H01L 29/785; H01L 29/6656; H01L 21/823431; H01L 21/823821; H01L 21/823468; H01L 21/823418; H01L 21/823814; H01L 21/823481; H01L 21/823878
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |

(Continued)

*Primary Examiner* — Tuan A Hoang
(74) *Attorney, Agent, or Firm* — NZ Carr Law Office

(57) ABSTRACT

A semiconductor device structure, along with methods of forming such, are described. The structure includes a plurality of semiconductor layers and a first source/drain epitaxial feature in contact with the plurality of semiconductor layers. The first source/drain epitaxial feature includes a bottom portion having substantially straight sidewalls. The structure further includes a spacer having a gate spacer portion and one or more source/drain spacer portions. Each source/drain spacer portion has a first height, and a source/drain spacer portion of the one or more source/drain spacer portions is in contact with one of the substantially straight sidewalls of the first source/drain epitaxial feature. The structure further includes a dielectric feature disposed adjacent one source/drain spacer portion of the one or more source/drain spacer portion. The dielectric has a second height substantially greater than the first height.

20 Claims, 40 Drawing Sheets

(56) References Cited

U.S. PATENT DOCUMENTS

| | | |
|---|---|---|
| 9,576,814 B2 | 2/2017 | Wu et al. |
| 9,608,116 B2 | 3/2017 | Ching et al. |
| 10,573,755 B1 * | 2/2020 | Frougier ........... H01L 29/66742 |
| 2019/0067120 A1 * | 2/2019 | Ching ................. H01L 27/0924 |

* cited by examiner

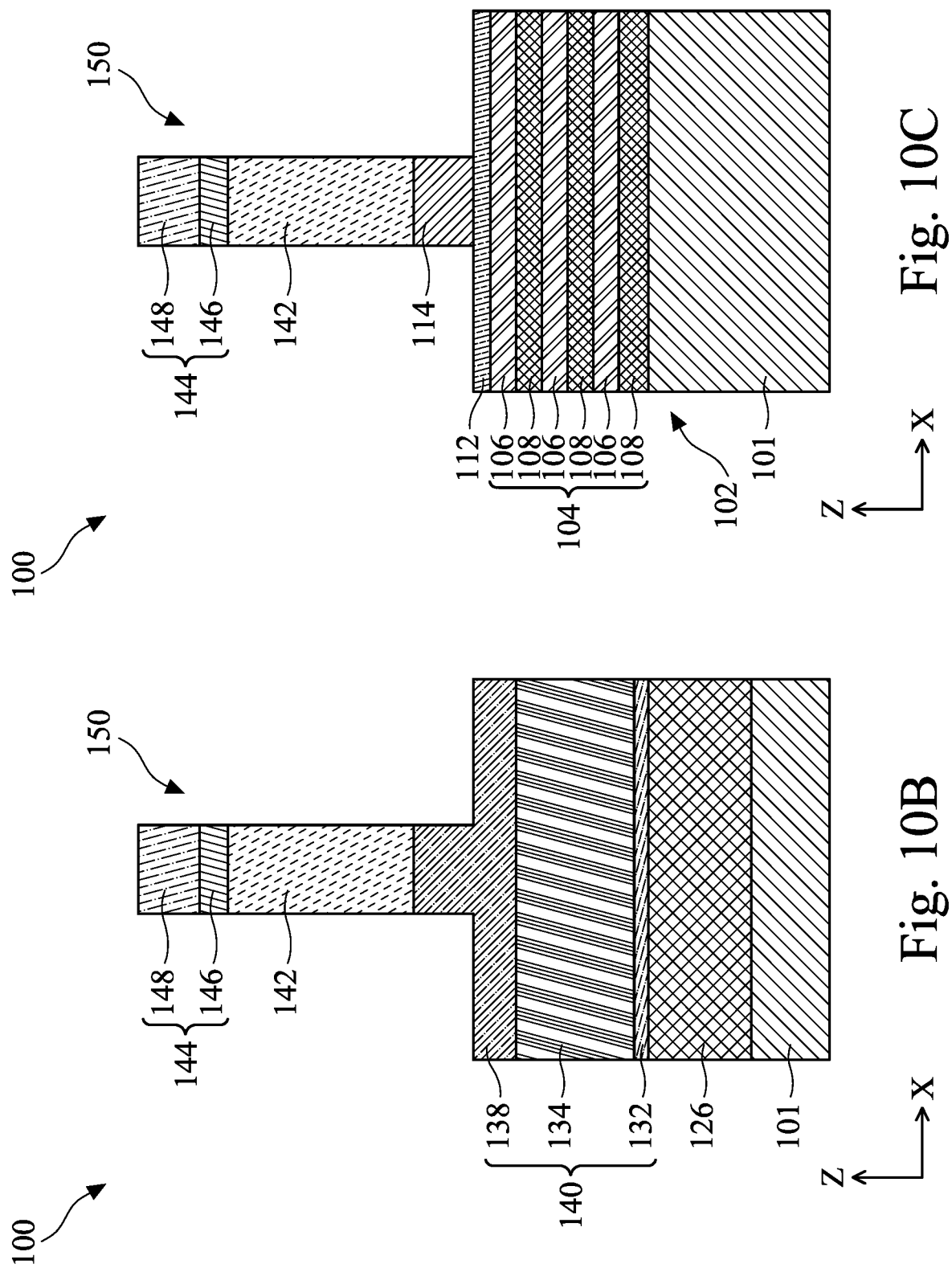

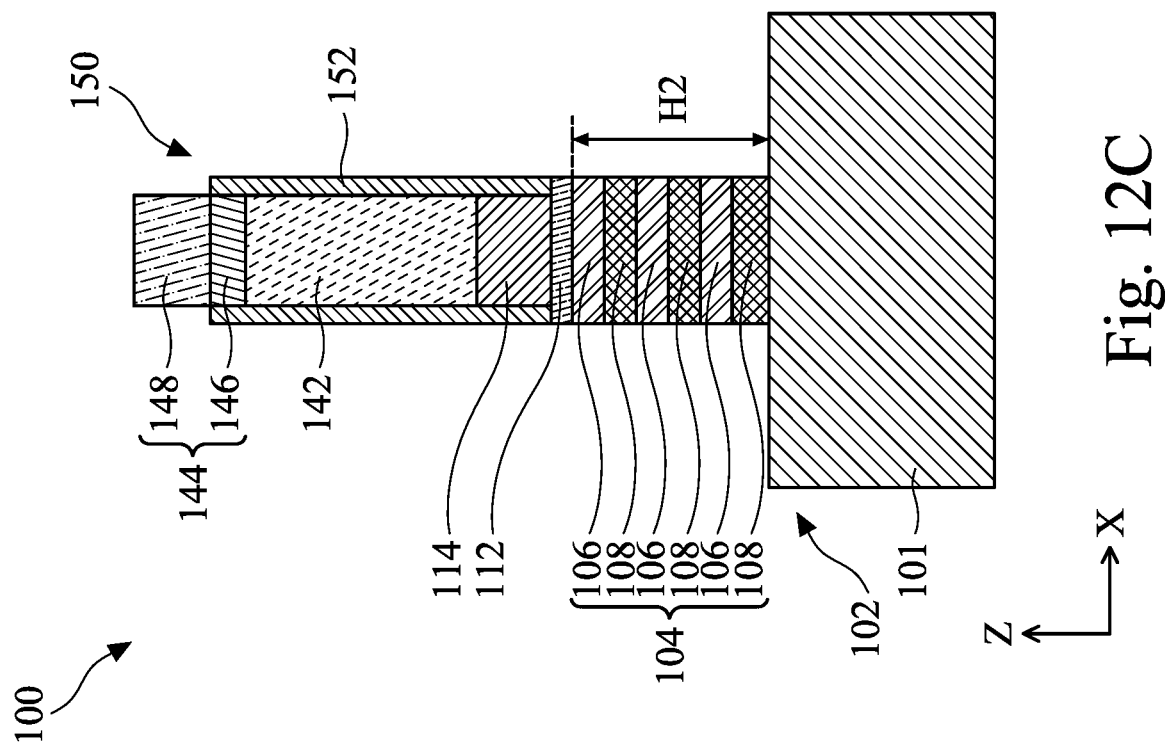
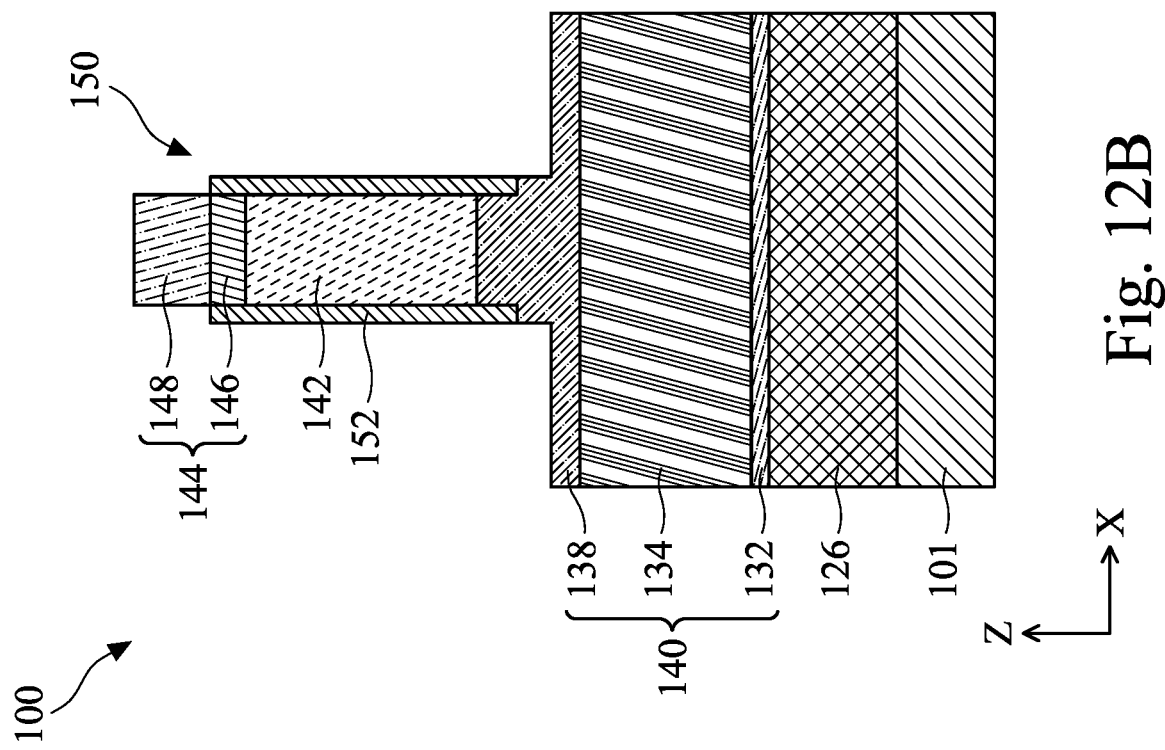
Fig. 12C
Fig. 12B

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A-14A are perspective views of various stages of manufacturing the semiconductor device structure, in accordance with some embodiments.

FIGS. 10B-14B are cross-sectional side views of various stages of manufacturing the semiconductor device structure taken along line B-B of FIG. 9, in accordance with some embodiments.

FIGS. 10C-14C are cross-sectional side views of various stages of manufacturing the semiconductor device structure taken along line C-C of FIG. 9, in accordance with some embodiments.

FIGS. 10D-14D are cross-sectional side views of various stages of manufacturing the semiconductor device structure taken along line D-D of FIG. 9, in accordance with some embodiments.

FIGS. 16A-18A are perspective views of various stages of manufacturing the semiconductor device structure, in accordance with some embodiments.

FIGS. 16B-18B are cross-sectional side views of various stages of manufacturing the semiconductor device structure taken along line B-B of FIG. 16A, in accordance with some embodiments.

FIGS. 16C-18C are cross-sectional side views of various stages of manufacturing the semiconductor device structure taken along line C-C of FIG. 16A, in accordance with some embodiments.

DETAILED DESCRIPTION

Figure 1:
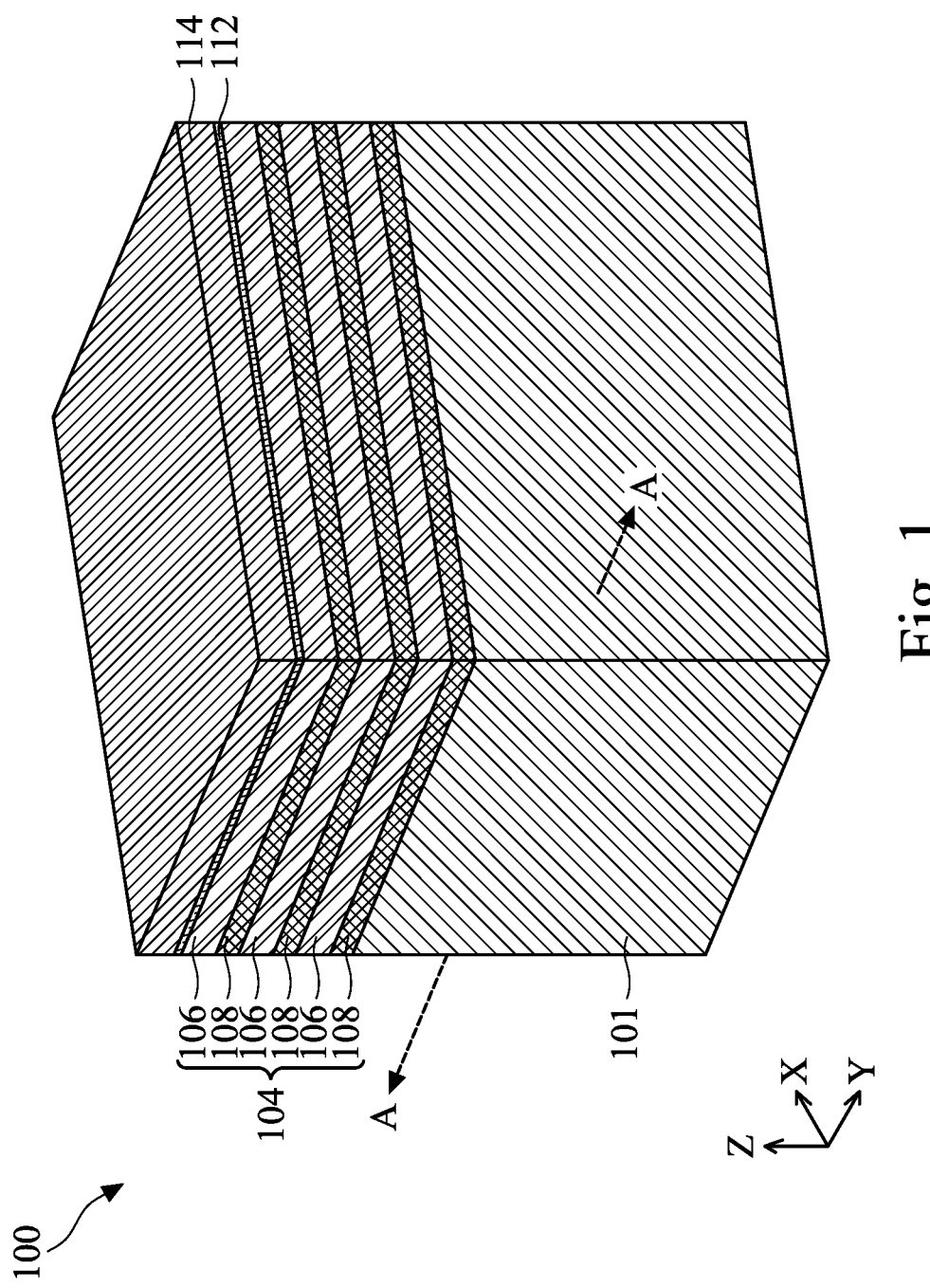
FIG. 1 is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-21 show exemplary sequential processes for manufacturing a semiconductor device structure 100, in accordance with some embodiments. It is understood that additional operations can be provided before, during, and after processes shown by FIGS. 1-21, and some of the operations described below can be replaced or eliminated, for additional embodiments of the method. The order of the operations/processes may be interchangeable.

As shown in FIG. 1, a stack of semiconductor layers 104 is formed over a substrate 101. The substrate 101 may be a semiconductor substrate. In some embodiments, the substrate 101 includes a single crystalline semiconductor layer on at least the surface of the substrate 101. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxide.

The substrate 101 may include one or more buffer layers (not shown) on the surface of the substrate 101. The buffer layers can serve to gradually change the lattice constant from that of the substrate 101 to that of the source/drain (S/D) regions to be grown on the substrate 101. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, and InP. In one embodiment, the substrate 101 includes SiGe buffer layers epitaxially grown on the silicon substrate 101. The germanium concentration of the SiGe buffer layers may increase from 30 atomic percent germanium for the bottom-most buffer layer to 70 atomic percent germanium for the top-most buffer layer.

The substrate 101 may include various regions that have been suitably doped with impurities (e.g., p-type or n-type impurities). The dopants are, for example boron for an n-type field effect transistor (FET) and phosphorus for a p-type FET.

The stack of semiconductor layers 104 includes first semiconductor layers 106 and second semiconductor layers 108. The first semiconductor layers 106 and the second semiconductor layers 108 are made of semiconductor materials having different etch selectivity and/or oxidation rates. For example, the first semiconductor layers 106 are made of Si and the second semiconductor layers 108 are made of SiGe. In some embodiments, the stack of semiconductor layers 104 includes alternating first and second semiconductor layers 106, 108. The first semiconductor layers 106 or portions thereof may form nano structure channel(s), such as nanosheet channel(s), of the semiconductor device structure 100. The semiconductor device structure 100 may include a nano structure transistor. The term nanostructure is used herein to designate any material portion with nanoscale, or even microscale dimensions, and having any suitable shape, such as an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanostructure channel(s) of the semiconductor device structure 100 may be surrounded by the gate electrode layer. The nano structure transistors may be referred to as nanosheet transistors, nanowire transistors, gate-all-around (GAA) transistors, multi-bridge channel (MBC) transistors, or any transistors having the gate electrode layer surrounding the channels. The use of the first semiconductor layers 106 to define a channel or channels of the semiconductor device structure 100 is further discussed below. In some embodiments, the first and second semiconductor layers 106, 108 are replaced with a single semiconductor material connected to the substrate 101, and the device is a FinFET.

It is noted that 3 layers of the first semiconductor layers 106 and 3 layers of the second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104; the number of layers depending on the predetermined number of channels for the semiconductor device structure 100. In some embodiments, the number of first semiconductor layers 106, which is the number of channels, is between 3 and 8.

As described in more detail below, the first semiconductor layers 106 may serve as channels for the semiconductor device structure 100 and the thickness is chosen based on device performance considerations. In some embodiments, each first semiconductor layer 106 has a thickness ranging from about 6 nanometers (nm) to about 12 nm. The second semiconductor layers 108 may eventually be removed and serve to define a vertical distance between adjacent channels for the semiconductor device structure 100 and the thickness is chosen based on device performance considerations. In some embodiments, each second semiconductor layer 108 has a thickness ranging from about 1.3 nm to about 14 nm. In some embodiments, as shown in FIG. 1, the stack of semiconductor layers 104 has a total thickness ranging from about 40 nm to about 60 nm.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

Figure 9:
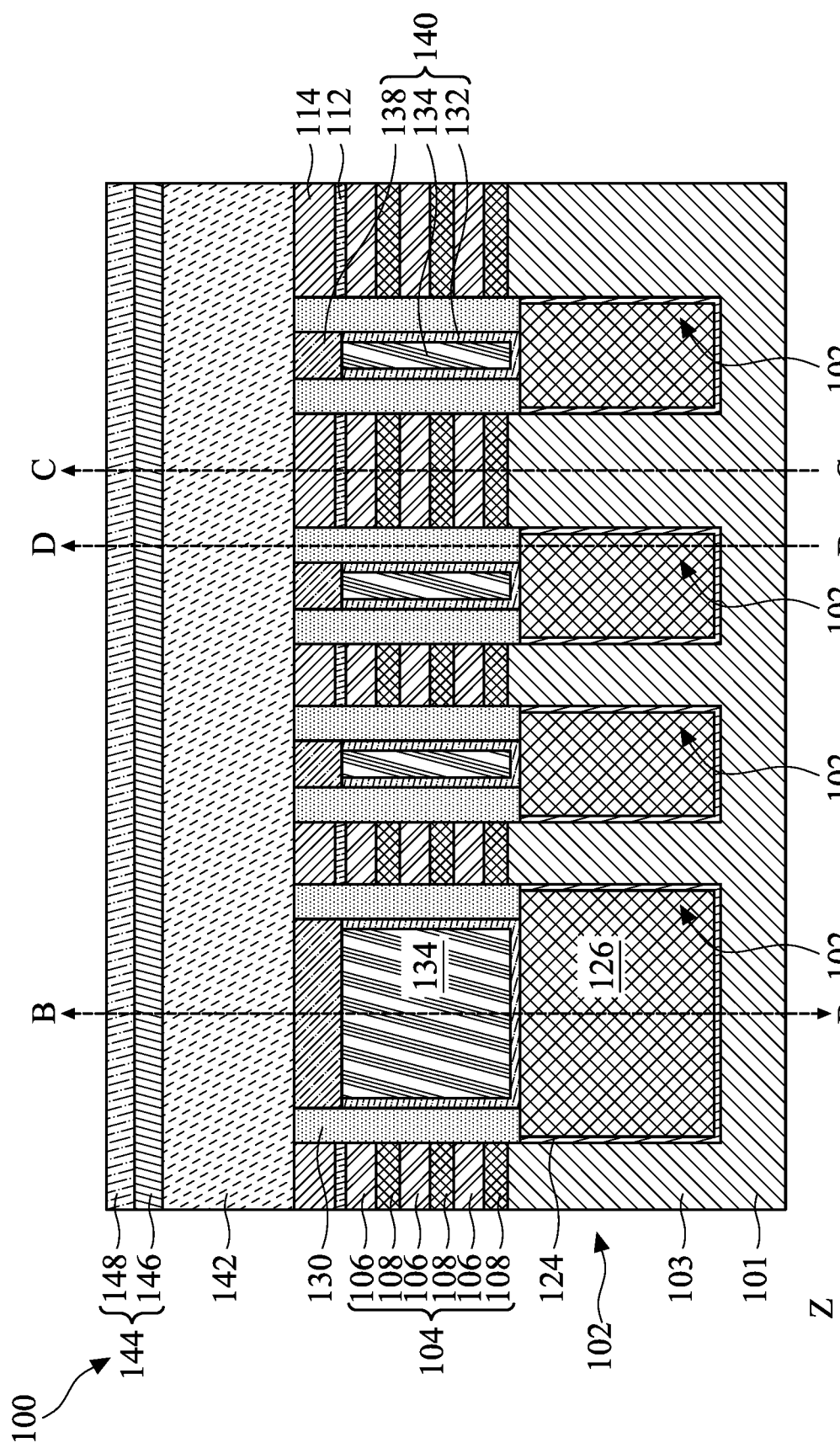

An oxide layer 112 is formed on the topmost semiconductor layer 106, and a semiconductor layer 114 is formed on the oxide layer 112, as shown in FIG. 1. The oxide layer 112 may be silicon oxide and may have different etch selectivity compared to the semiconductor layer 114. The semiconductor layer 114 may include the same material as a sacrificial gate electrode layer 142 (FIG. 9). In some embodiments, the semiconductor layer 114 includes silicon.

Figure 2:
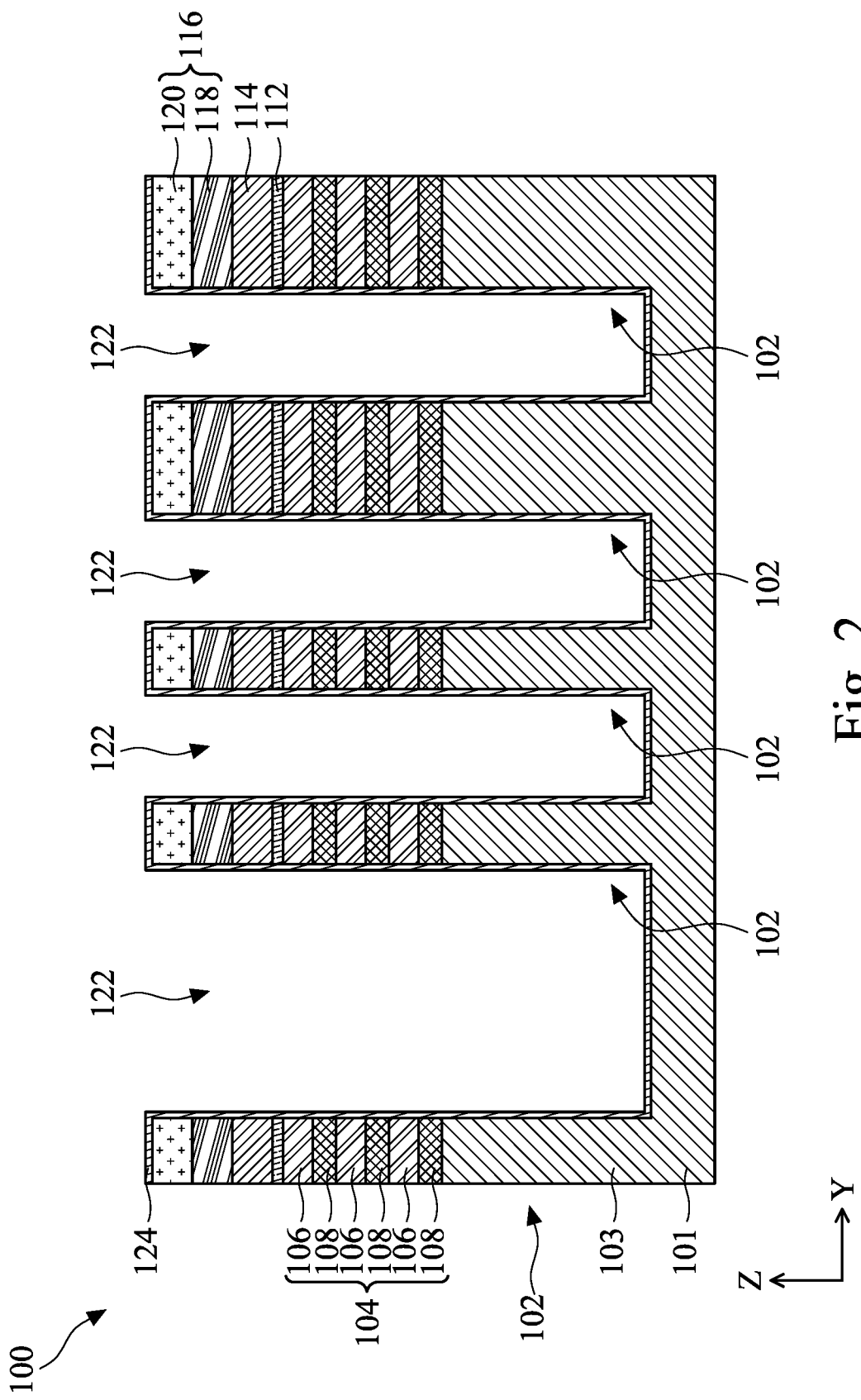
FIGS. 2-9 are cross-sectional side views of various stages of manufacturing the semiconductor device structure taken along line A-A of FIG. 1, in accordance with some embodiments.

FIGS. 2-9 are cross-sectional side views of various stages of manufacturing the semiconductor device structure 100 taken along line A-A of FIG. 1, in accordance with some embodiments. As shown in FIG. 2, a mask structure 116 is formed over the oxide layer 112, and a plurality of fins 102 are formed. The mask structure 116 may include an oxygen-containing layer 118 and a nitrogen-containing layer 120. The oxygen-containing layer 118 may be a pad oxide layer, such as a $SiO_2$ layer. The nitrogen-containing layer 120 may be a pad nitride layer, such as $Si_3N_4$ layer. The mask structure 116 may be formed by any suitable deposition process, such as chemical vapor deposition (CVD) process. The mask structure 116 may be used to form the fins 102. For example, a pattern is first formed in the mask structure 116, and the pattern is then transferred from the mask structure 116 to the layers disposed therebelow. Each fin 102 includes a substrate portion 103 formed from the substrate 101, a portion of the stack of semiconductor layers 104, a portion of the oxide layer 112, a portion of the semiconductor layer 114, and a portion of the mask structure 116. The fins 102 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 102 by etching the semiconductor layer 114, the oxide layer 112, the stack of semiconductor layers 104, and the substrate 101. The etching process can include dry etching, wet etching, reactive ion etching (RIE), and/or other suitable processes. As shown in FIG. 2, 5 fins are formed, but the number of the fins is not limited to 5. Two or more fins may be arranged in the Y direction in some embodiments. Trenches 122 are formed between adjacent fins 102.

As described above, the first semiconductor layers 106 may serve as channels in a nanostructure transistor device. The width along the Y direction of each fin 202 may be the device's channel width. Some fins 102 may have wider width than other fins 102, as shown in FIG. 2. The device with a wider channel may be more suitable for high-speed applications, such as a NAND device. The device with a narrower channel may be more suitable for low-power and low-leakage applications, such as an inverter device. In some embodiments, both devices having narrow channel and wide channel may be formed in the same column (along the Y direction), as shown in FIG. 2, in applications such as system on a chip (SOC) devices. The distances between adjacent fins 102 may vary, as shown in FIG. 2. In some embodiments, adjacent fins used to form similar devices may be spaced apart by a first distance, and adjacent fins 102 used to form different devices may be spaced apart by a second distance greater than the first distance.

As shown in FIG. 2, a liner 124 is formed over the substrate 101 and the fins 102. The liner 124 may be made of a semiconductor material, such as Si. In some embodiments, the liner 124 is made of the same material as the substrate 101. The liner 124 may be a conformal layer and may be formed by a conformal process, such as an atomic layer deposition (ALD) process. The term "conformal" may be used herein for ease of description upon a layer having substantial same thickness over various regions.

Figure 3:
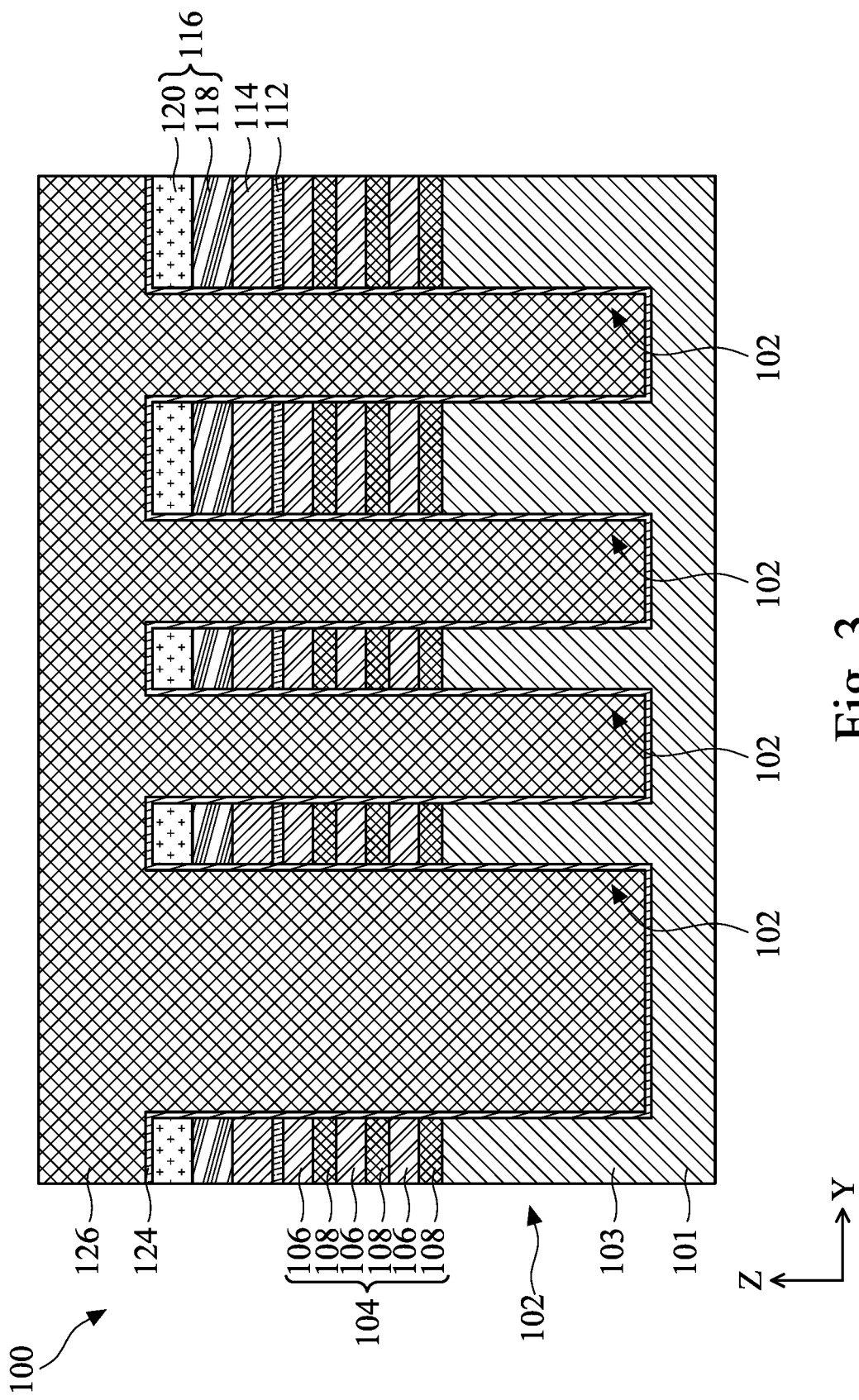

As shown in FIG. 3, an insulating material 126 is formed on the substrate 101. The insulating material 126 fills the trenches 122 (FIG. 2) and is formed over the fins 102. The insulating material 126 may be made of an oxygen-containing material, such as silicon oxide or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon oxide); or any suitable dielectric material. The insulating material 126 may be formed by any suitable method, such as low-pressure chemical vapor deposition (LPCVD), plasma enhanced CVD (PECVD) or flowable CVD (FCVD).

Figure 4:
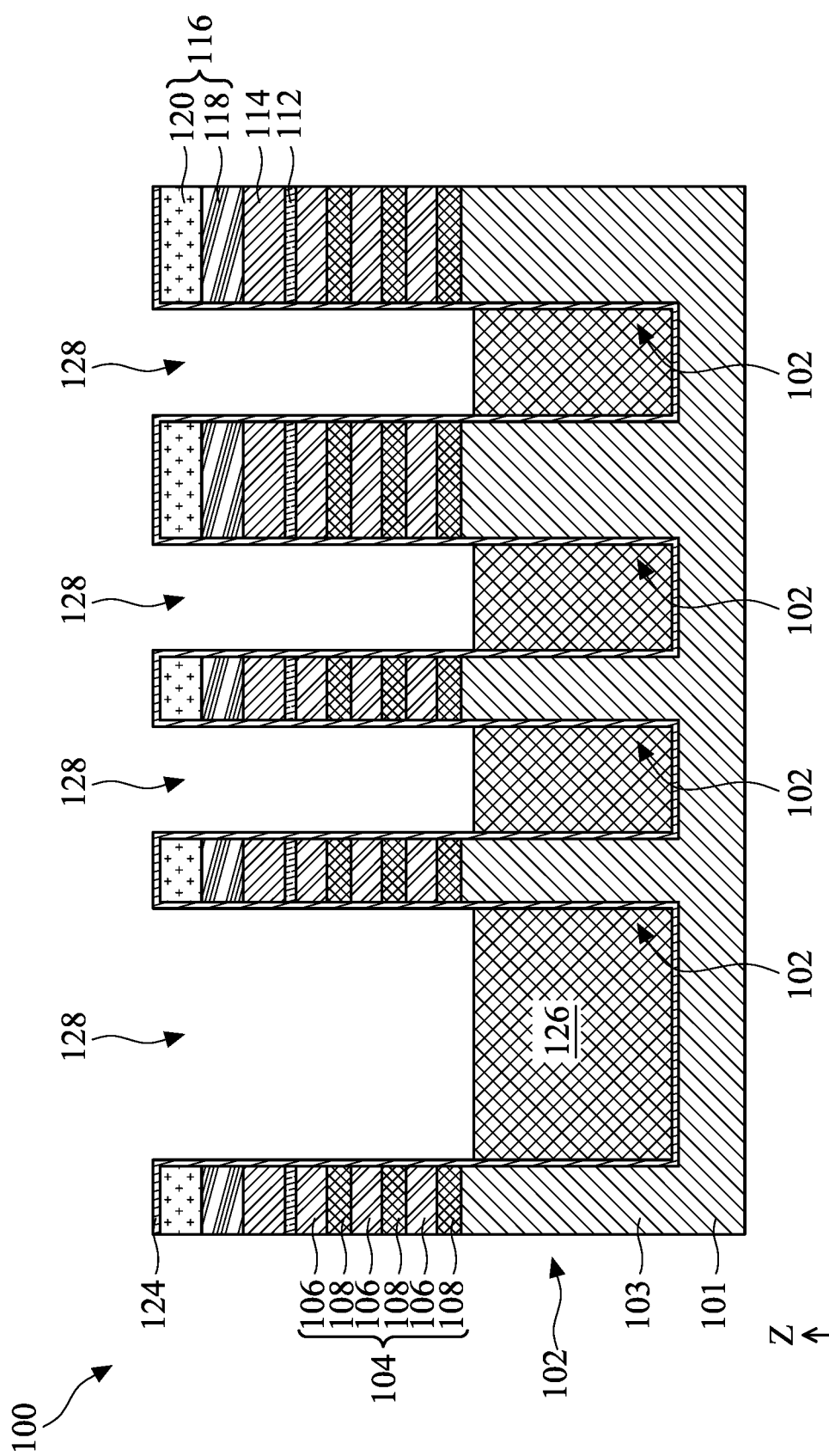

As shown in FIG. 4, a planarization process is performed to expose the semiconductor layer 114, and the insulating material 126 is recessed. The planarization process may be any suitable process, such as a chemical mechanical polishing (CMP) process. The mask structure 116 may be removed by the planarization process. The insulating material 126 may be recessed by removing a portion of the insulating material 126 located between adjacent fins 102 to form trenches 128. The trenches 128 may be formed by any suitable removal process, such as dry etching or wet etching that selectively removes the insulating material 126 but not the semiconductor material of the liner 124. The recessed insulating material 126 may be the shallow trench isolation (STI). The insulating material 126 includes a top surface that may be level with or below a surface of the second semiconductor layer 108 in contact with the substrate portion 103.

Figure 5:
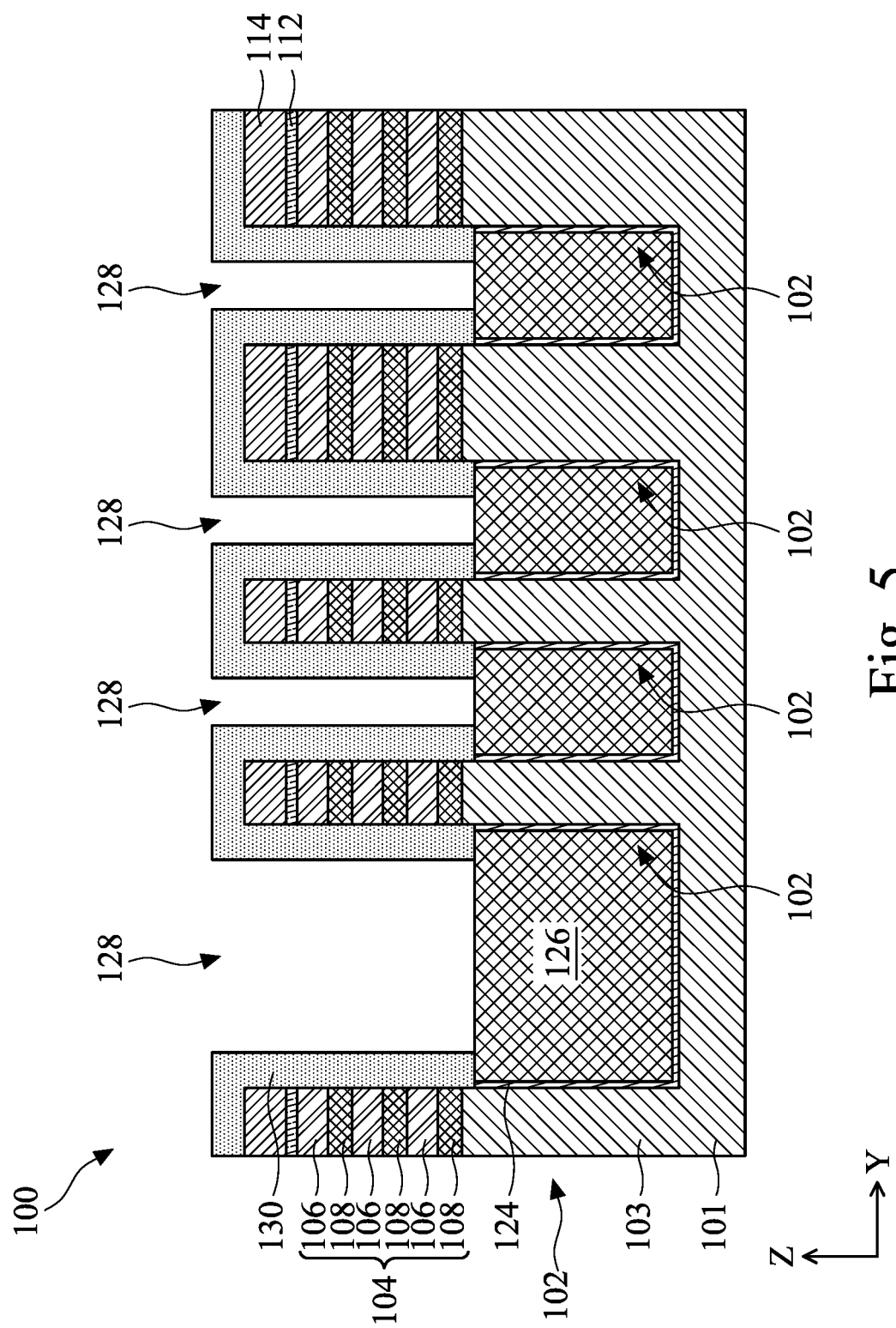

As shown in FIG. 5, a cladding layer 130 is formed on the exposed surface of the liner 124. The liner 124 may be diffused into the cladding layer 130 during the formation of the cladding layer 130. Thus, in some embodiments, the cladding layer 130 is in contact with the stack of semiconductor layers 104, as shown in FIG. 5. In some embodiments, the cladding layer 130 includes a semiconductor material. The cladding layer 130 grows on semiconductor materials but not on dielectric materials. For example, the cladding layer 130 includes SiGe and is grown on the Si of the liner 124 but not on the dielectric material of the insulating material 126. In some embodiments, the cladding layer 130 may be formed by first forming a semiconductor layer on the liner 124 and the insulating material 126, and followed by an etch process to remove portions of the semiconductor layer formed on the insulating material 126. The etch process may remove some of the semiconductor layer formed on the top of the fins 102, and the cladding layer 130 formed on the top of the fins 102 may have a curved profile instead of a flat profile. In some embodiments, the cladding layer 130 and the second semiconductor layers 108 include the same material having the same etch selectivity. For example, the cladding layer 130 and the second semiconductor layers 108 include SiGe. The cladding layer 130 and the second semiconductor layer 108 may be removed subsequently to create space for a spacer and the gate electrode layer.

Figure 6:
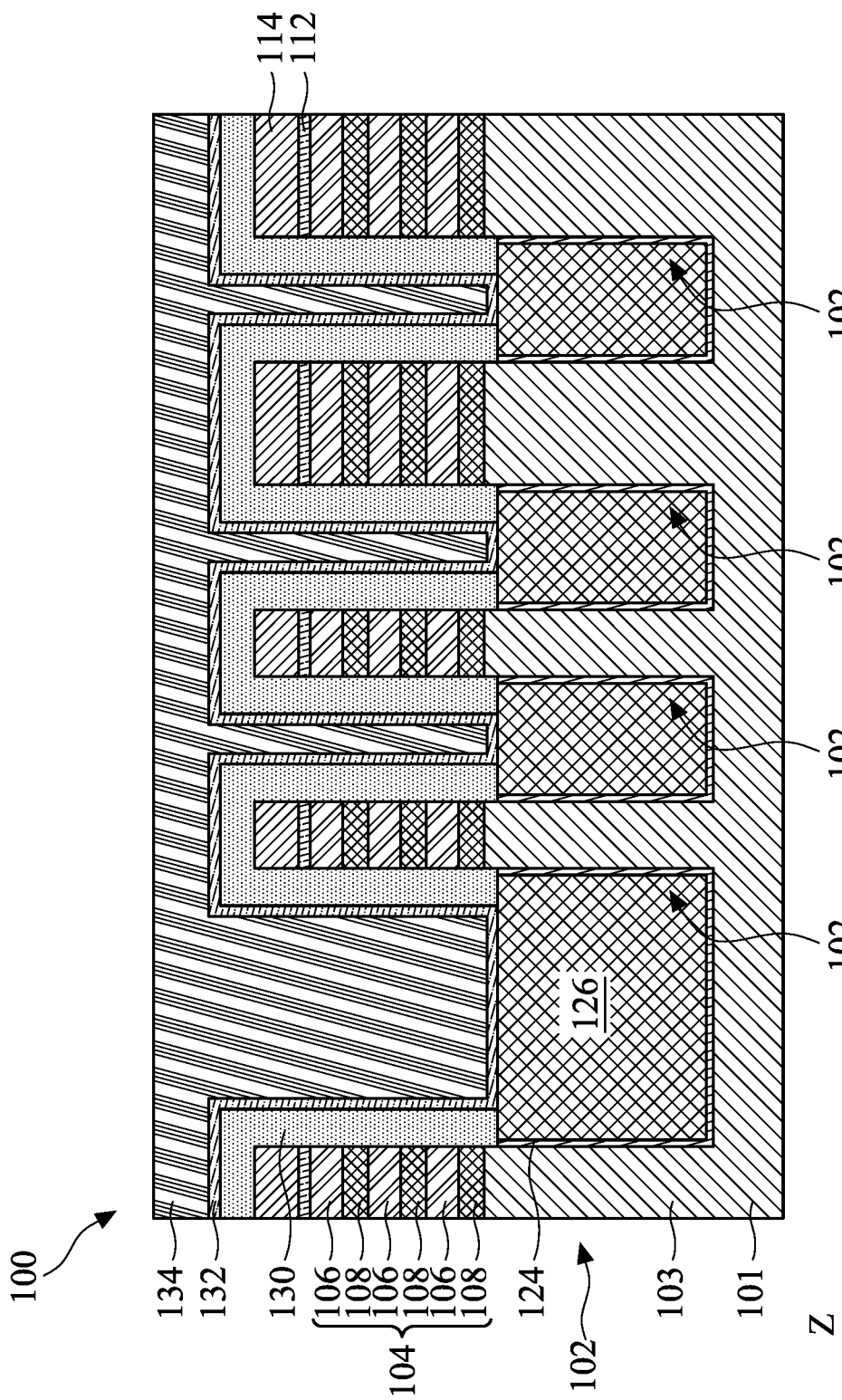

As shown in FIG. 6, a liner 132 and a dielectric material 134 are formed in the trenches 128 (FIG. 5) and over the top of the fins 102. The liner 132 may include dielectric material having a K value lower than 7, such as SiCN, SiOC, or SiOCN. The liner 132 may be formed by a conformal process, such as an ALD process. The dielectric material 134 may include the same material as the insulating material 126 and may be formed by a flowable process, such as an FCVD process.

Figure 7:
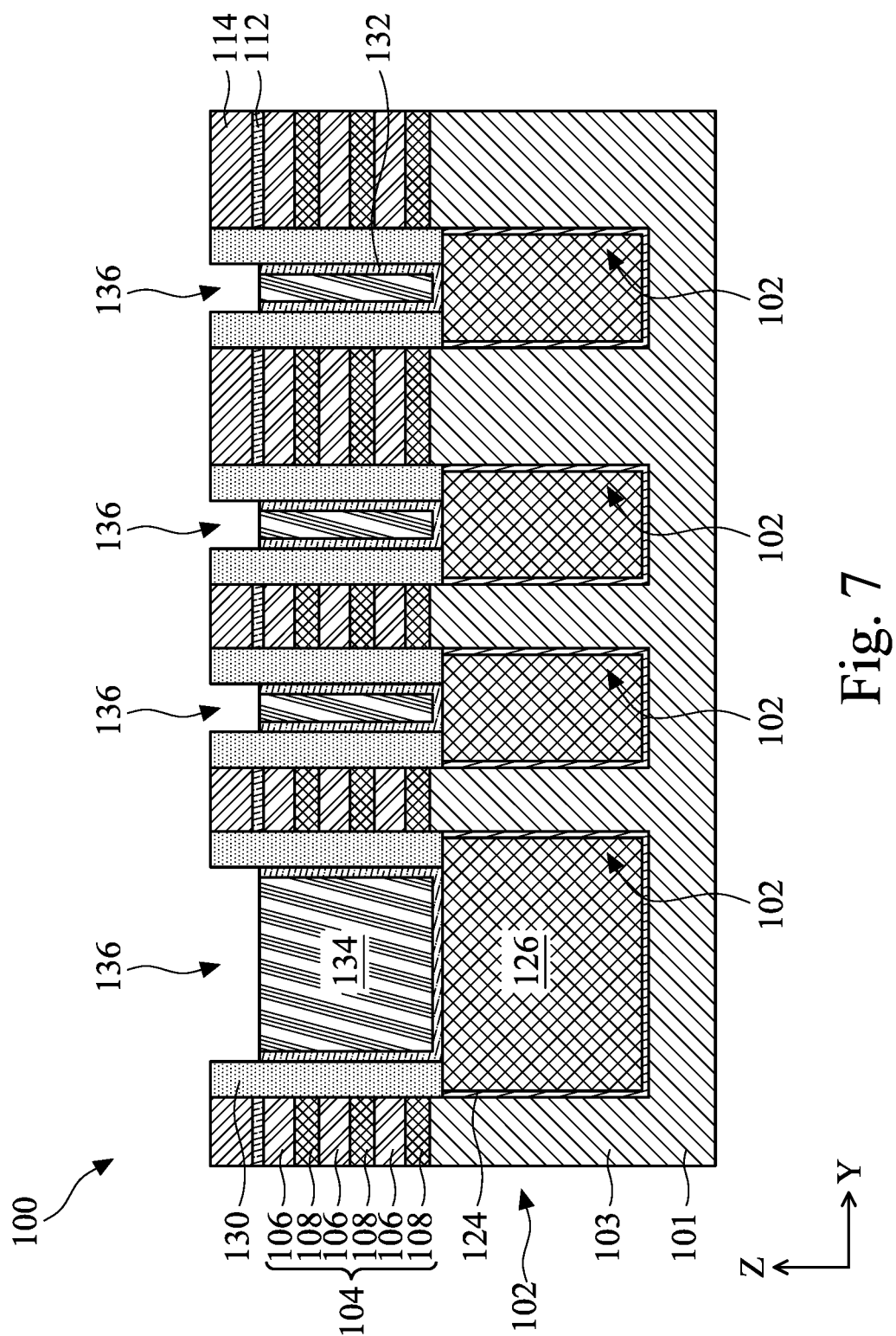

As shown in FIG. 7, a planarization process is performed to expose the semiconductor layer 114, and the liner 132 and the dielectric material 134 are recessed. The planarization process may be any suitable process, such as a CMP process. The planarization process removes portions of the dielectric material 134 and portions of the liner 132 disposed on the portions of the cladding layer 130 disposed over the top of the fins 102. The portions of the cladding layer 130 disposed over the top of the fins 102 may be also removed by the planarization process. The recess of the liner 132 and the dielectric material 134 may be performed by any suitable process, such as dry etch, wet, etch, or a combination thereof. The recess of the liner 132 and the dielectric material 134 may be a selective process, and the semiconductor material of the cladding layer 130 and the semiconductor layer 114 are not substantially affected. The recess process may be controlled so that the liner 132 and the dielectric materials 134 are substantially at the same level as or below a top surface of the topmost first semiconductor layer 106 in the stack of semiconductor layers 104. In some embodiments, the top surface of the dielectric material 134 may be about 0 nm to about 10 nm below the level of the top surface of the topmost first semiconductor layer 106. The top surface of the topmost first semiconductor layer 106 may be in contact with the oxide layer 112. As a result of the recess process, trenches 136 are formed between adjacent fins 102.

Figure 8:
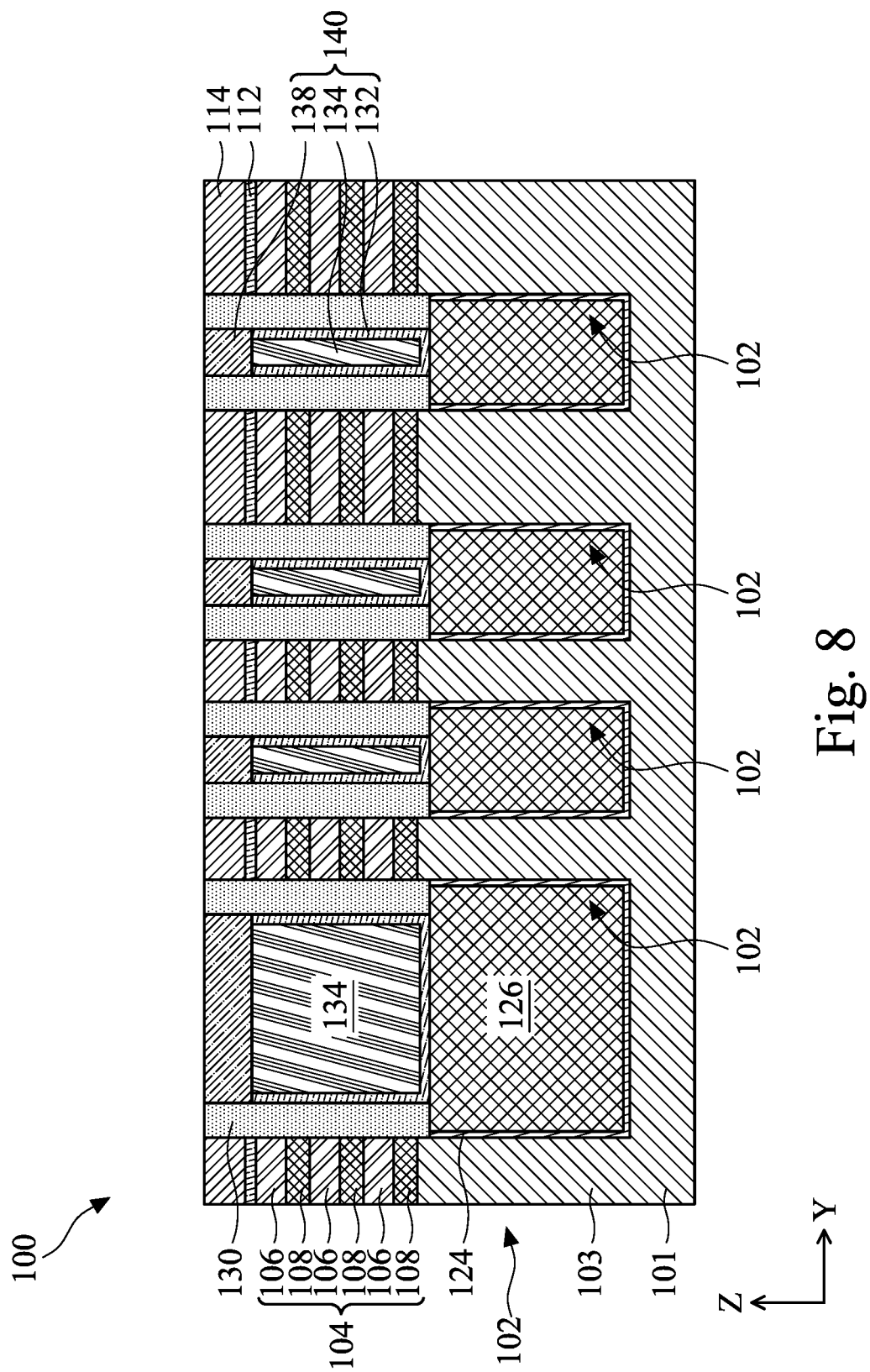

As shown in FIG. 8, a high-K dielectric layer 138 is formed in each trench 136 (FIG. 7). The high-K dielectric layer 138 may include a material having a K value greater than that of silicon oxide, such as $HfO_2$, $ZrO_2$, $HfAlO_x$, $HfSiO_x$, or $Al_2O_3$. In some embodiments, the high-K dielectric layer 138 includes a material having a K value greater than 7. The high-K dielectric layer 138 may be formed by any suitable process, such as a CVD, PECVD, FCVD, or ALD process. The high-K dielectric layer 138 may have a height along the Z direction ranging from about 10 nm to about 30 nm. The high-K dielectric layer 138 may be utilized to separate, or cut-off, the subsequently formed gate electrode layers. Thus, if the height is less than about 10 nm, the gate electrode layers may not be sufficiently cut-off. On the other hand, if the height is greater than about 30 nm, the manufacturing cost is increased without significant advantage.

Figure 19:
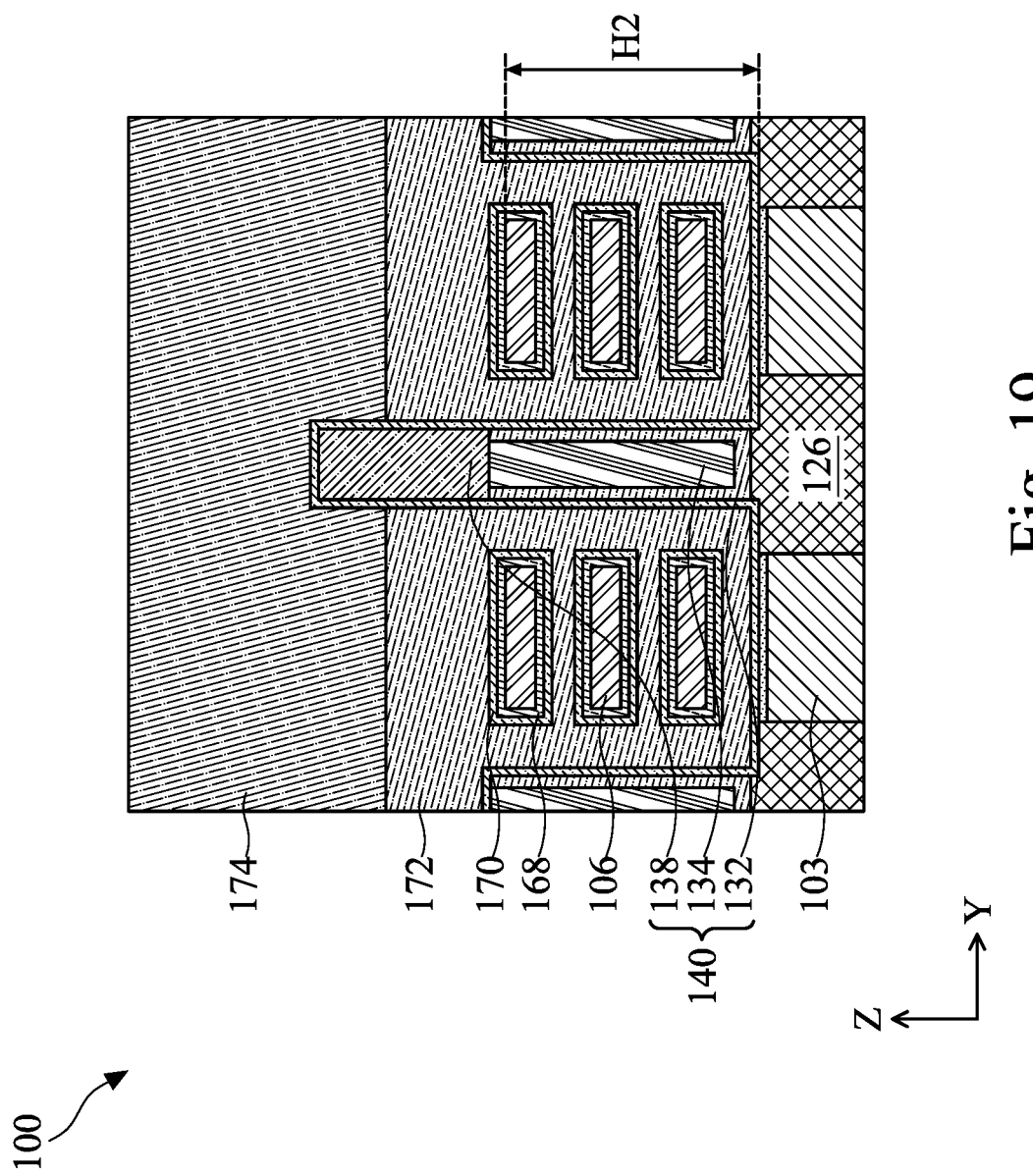
FIG. 19 is a cross-sectional side view of one of various stages of manufacturing the semiconductor device structure, in accordance with some embodiments.

The high-K dielectric layer 138 may be initially formed in the trenches 136 (FIG. 7) and over the semiconductor layer 114 and the cladding layer 130. Portions of the high-K dielectric layer 138 formed over the semiconductor layer 114 and the cladding layer 130 may be removed by a planarization process, as shown in FIG. 8. The top surfaces of the cladding layer 130 and the semiconductor layer 114 may be substantially co-planar with the top surfaces of the high-K dielectric layer 138. As shown in FIG. 8, the high-K dielectric layer 138, the dielectric material 134, and the liner 132 disposed in the trench 136 (FIG. 7) together may be referred to as a dielectric feature 140. The dielectric features 140 can separate the S/D epitaxial features 156 (FIG. 14A) and the gate electrode layers 172 (FIG. 19). In some embodiments, the dielectric feature 140 is a hybrid fin. In some embodiments, the dielectric feature 140 is a single dielectric material. In some embodiments, the dielectric feature 140 includes two or more dielectric materials.

As shown in FIG. 9, a sacrificial gate electrode layer 142 and a mask structure 144 are formed on the substantially planar surface of the semiconductor device structure 100. The sacrificial gate electrode layer 142 may include polycrystalline silicon (polysilicon). In some embodiments, the sacrificial gate electrode layer 142 includes the same material as the semiconductor layer 114. The mask structure 144 may include an oxygen-containing layer 146 and a nitrogen-containing layer 148. The oxygen-containing layer 146 may include the same material as the oxygen-containing layer 118 (FIG. 2), and the nitrogen-containing layer 148 may include the same material as the nitrogen-containing layer 120 (FIG. 2). In some embodiments, the sacrificial gate electrode layer 142 and the mask structure 144 are formed by various processes such as layer deposition, for example, CVD (including both LPCVD and PECVD), PVD, ALD, thermal oxidation, e-beam evaporation, or other suitable deposition techniques, or combinations thereof.

FIGS. 10A-14A are perspective views of various stages of manufacturing the semiconductor device structure 100, in accordance with some embodiments. FIGS. 10B-14B are cross-sectional side views of various stages of manufacturing the semiconductor device structure 100 taken along line B-B of FIG. 9, in accordance with some embodiments. FIGS. 10C-14C are cross-sectional side views of various stages of manufacturing the semiconductor device structure 100 taken along line C-C of FIG. 9, in accordance with some embodiments. FIGS. 10D-14D are cross-sectional side views of various stages of manufacturing the semiconductor device structure 100 taken along line D-D of FIG. 9, in accordance with some embodiments.

Figure 10A:
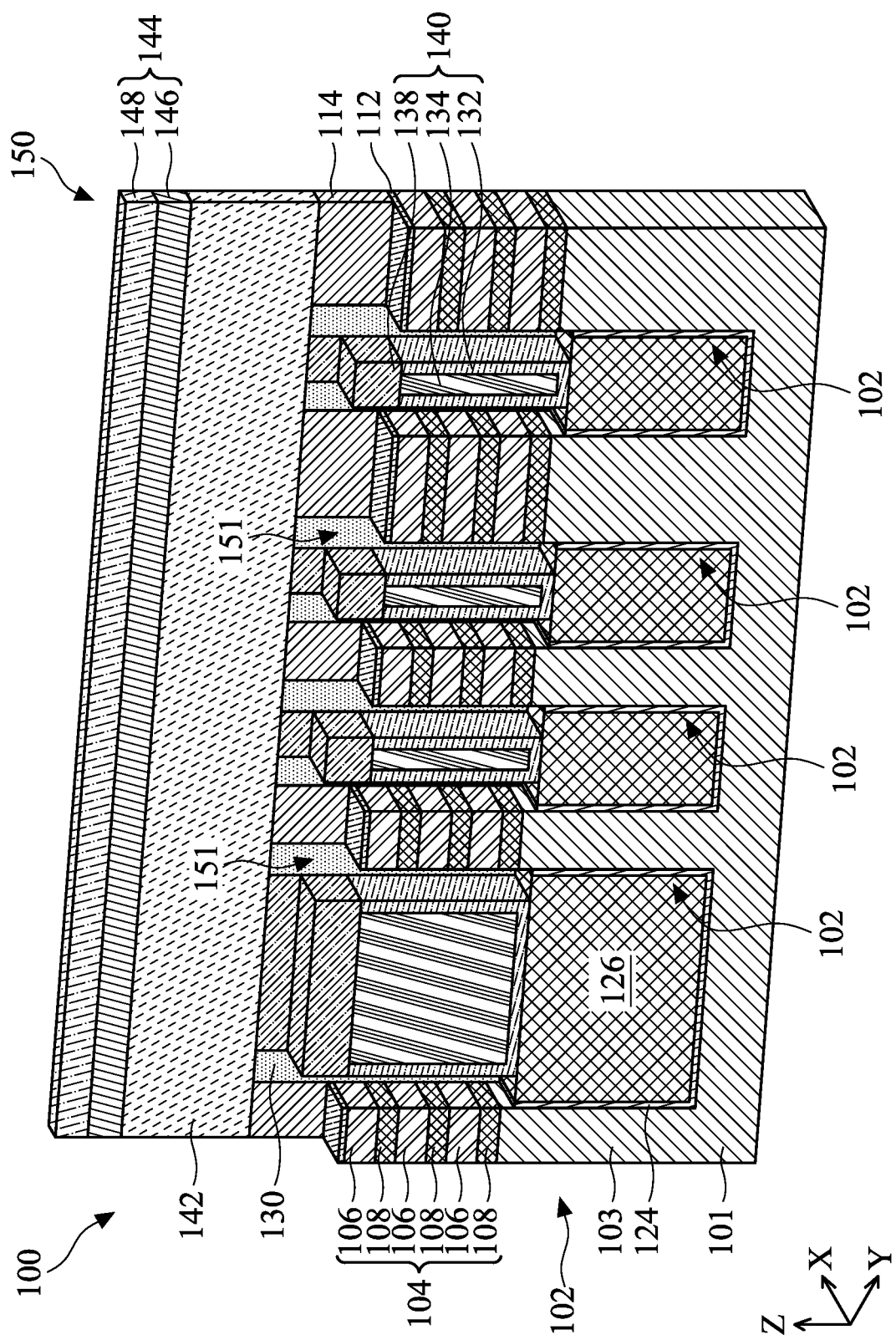
Figure 10D:
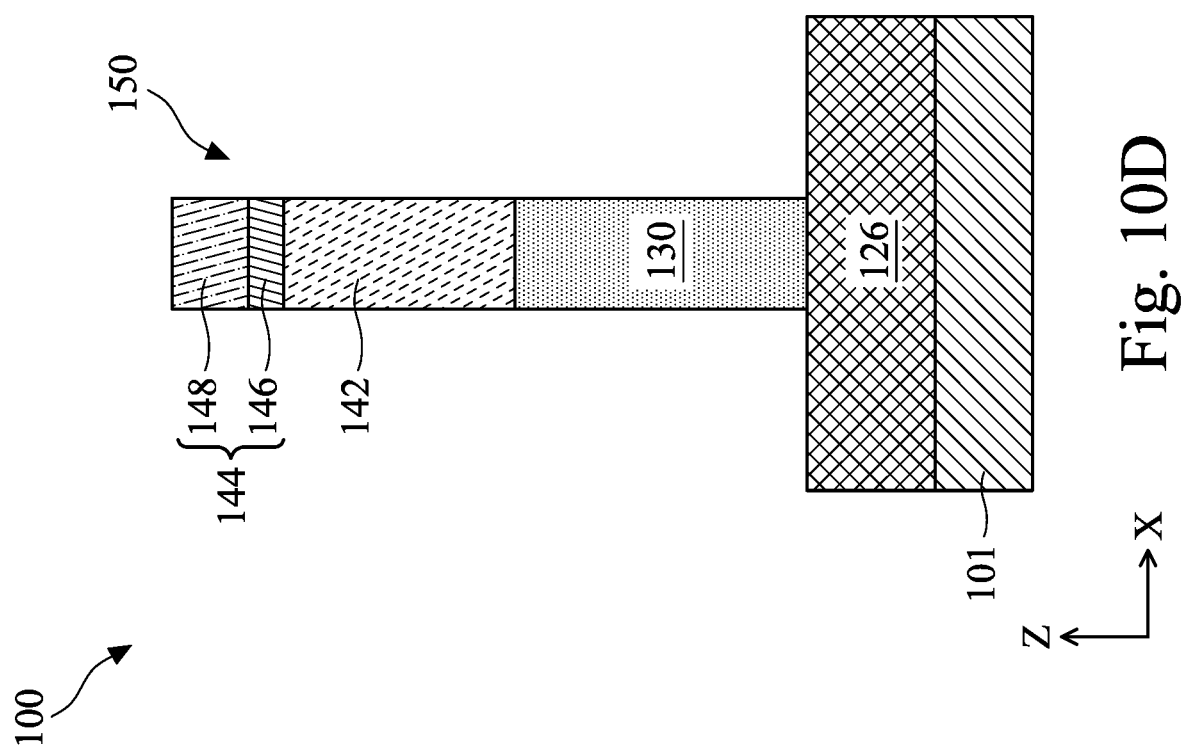

As shown in FIGS. 10A-10D, portions of the sacrificial gate electrode layer 142 and the mask structure 144 are removed to form a sacrificial gate stack 150. Portions of the semiconductor layer 114, the high-K dielectric layer 138, and the cladding layers 130 may be also removed or recessed. The sacrificial gate stack 150 may be formed by patterning and etching processes. For example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, other etching methods, and/or combinations thereof. The portions of the semiconductor layer 114 and the cladding layers 130 not covered by the sacrificial gate stack 150 may be removed during the removal of the portions of the sacrificial gate electrode layer 142. For example, anisotropic etching may be performed to remove the portions of the sacrificial gate electrode layer 142, the portions of the semiconductor layer 114, and the portions of the cladding layer 130, while the stack of semiconductor layers 104 are not substantially affected. The oxide layer 112 may function as an etch stop layer to protect the first semiconductor layer 106. As a result of the removal of the portions of the cladding layers 130, gaps 151 are formed between the stack of semiconductor layers 104 and the adjacent dielectric feature 140, as shown in FIG. 10A. As shown in FIGS. 10B, 10C, 10D, one sacrificial gate stack 150 is formed, but the number of the sacrificial gate stacks 150 is not limited to one. Two or more sacrificial gate stacks 150 are arranged in the X direction in some embodiments. As shown in FIGS. 10A and 10B, portions of the high-K dielectric layer 138 not covered by the sacrificial gate stack 150 are recessed. As a result, the portion of the high-K dielectric layer 138 under the sacrificial gate stack 150 has a thickness greater than the portions of the high-K dielectric layer 138 not covered by the sacrificial gate stack 150.

Figure 11A:
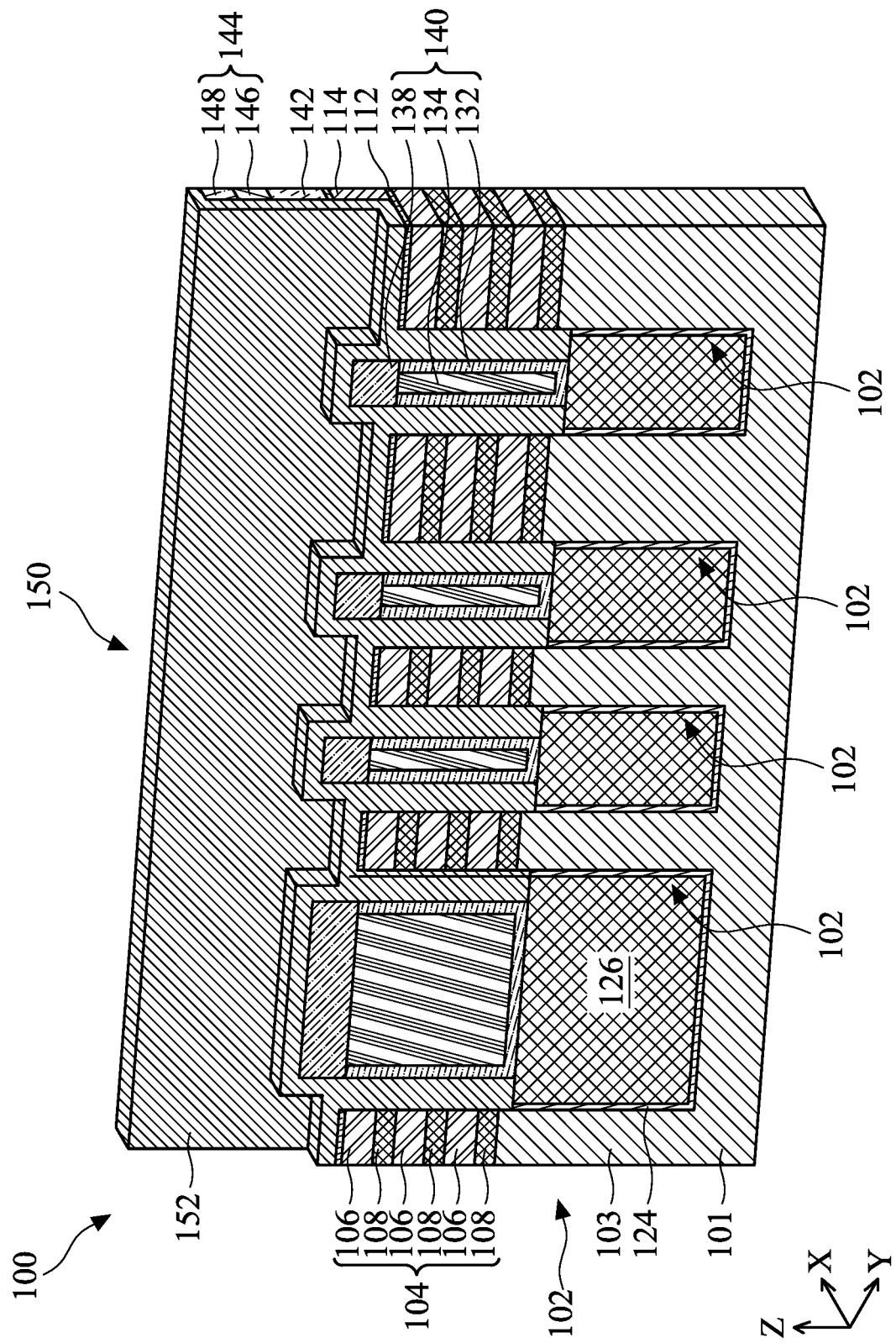
Figure 11C:
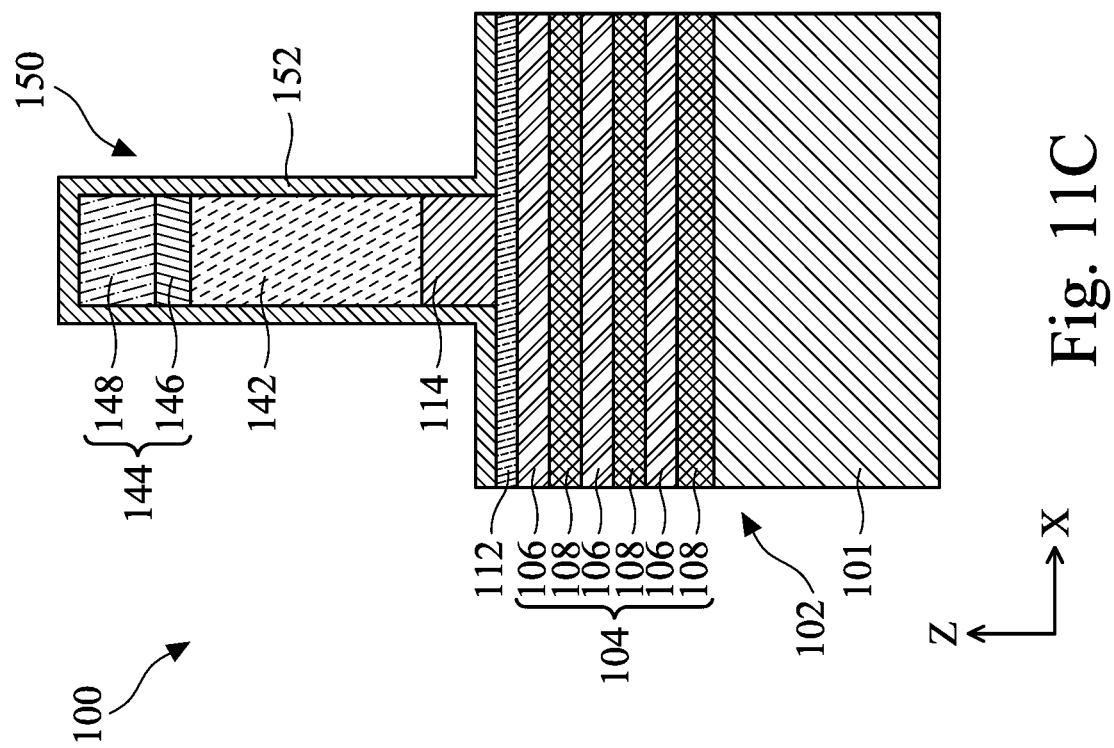
Figure 11B:
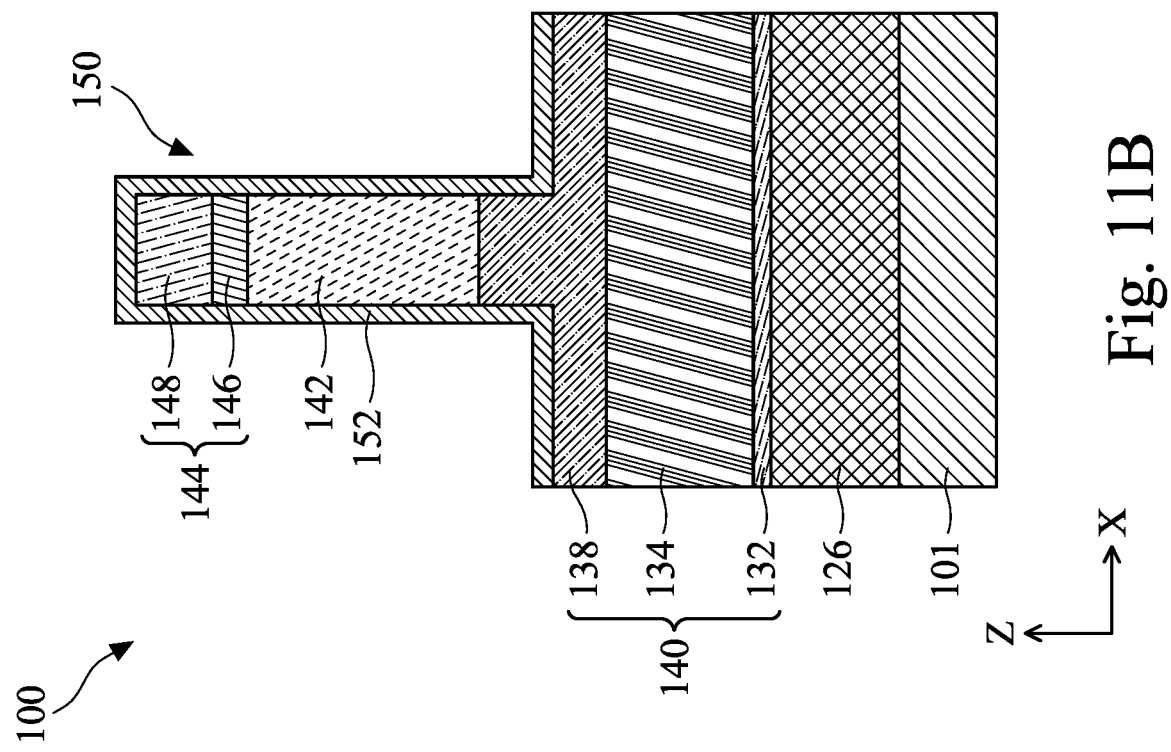
Figure 11D:
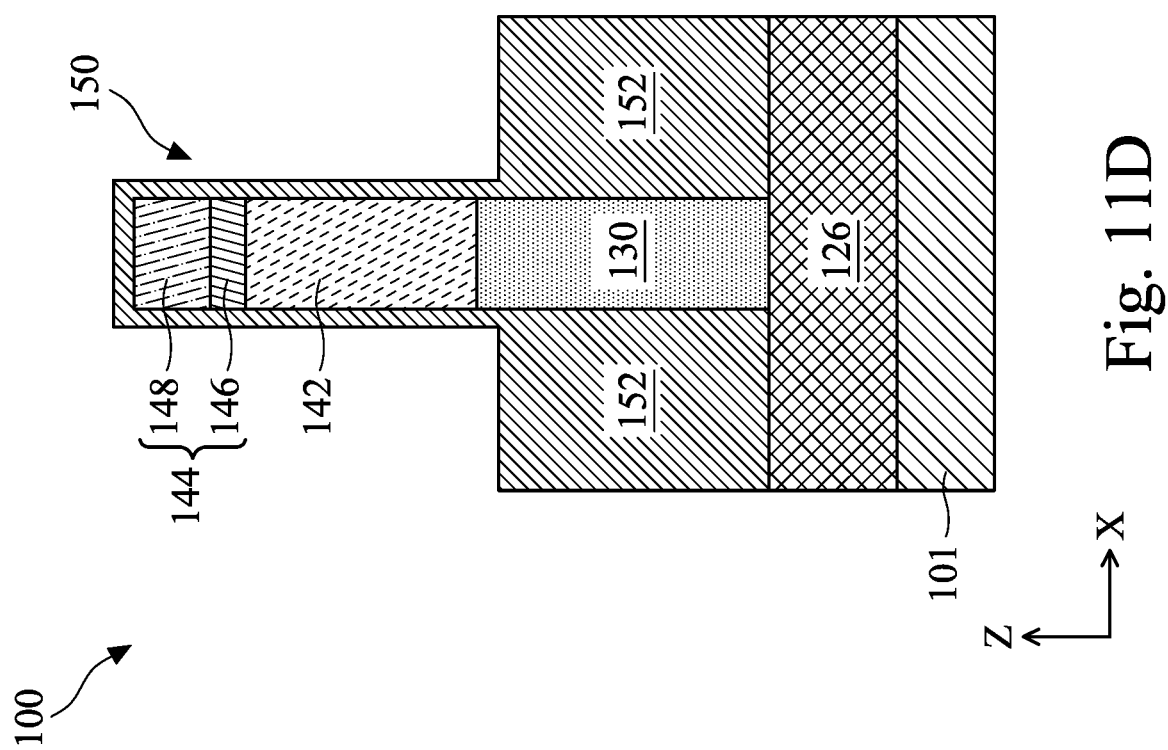

As shown in FIGS. 11A-11D, a spacer 152 is formed on the exposed surfaces of the semiconductor device structure 100. The spacer 152 may be formed by any suitable process, such as ALD. For example, the spacer 152 may be conformally on the exposed surfaces of the semiconductor device structure 100. The spacer 152 may be made of a dielectric material such as silicon oxide, silicon nitride, silicon carbide, silicon oxynitride, SiCN, silicon oxycarbide, SiOCN, and/or combinations thereof. In some embodiments, the spacer 152 includes multiple layers, such as main spacer walls, liner layers, and the like. The spacer 152 may fill the gaps 151, as shown in FIG. 11A.

Figure 12A:
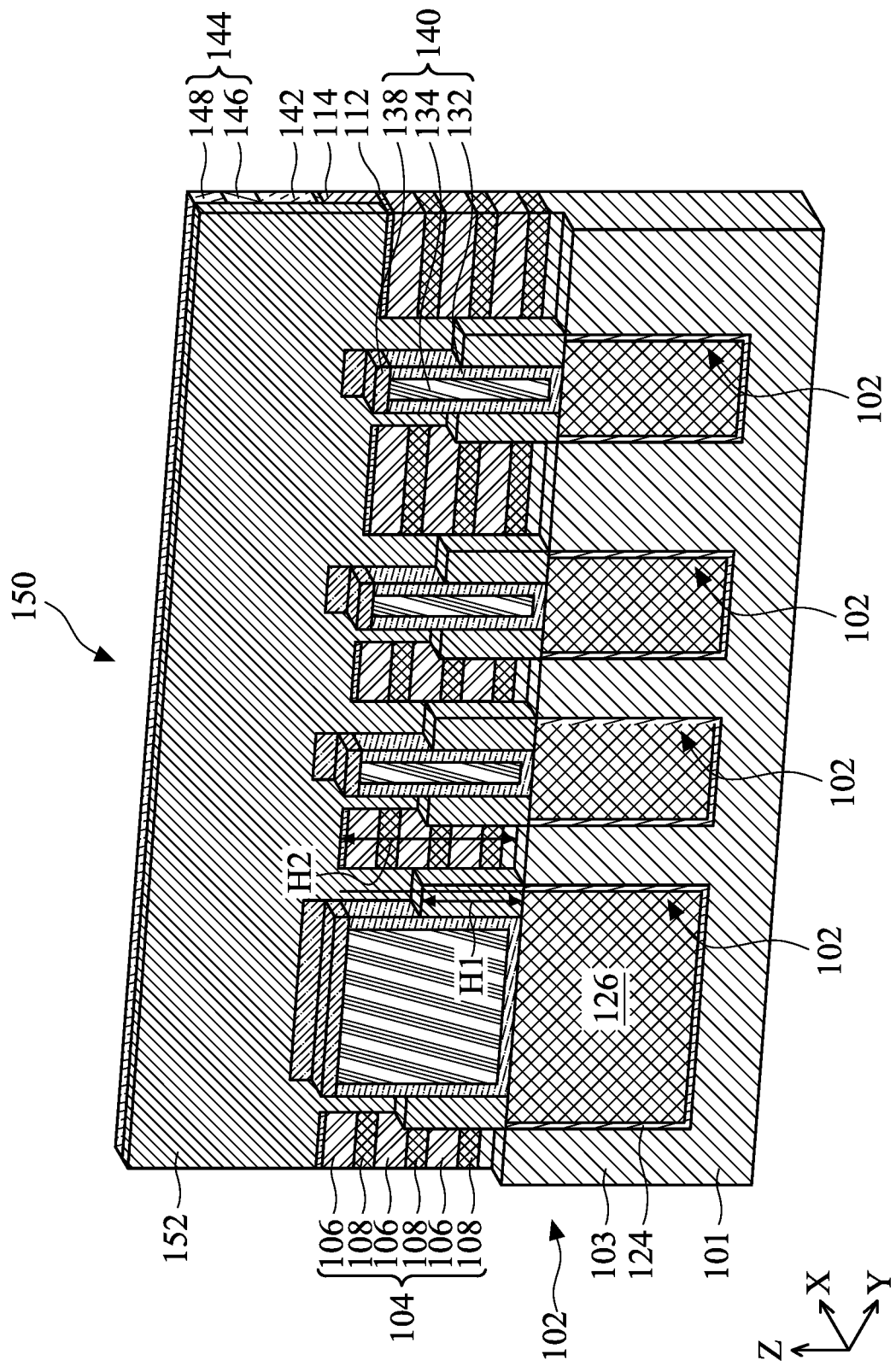
Figure 12D:
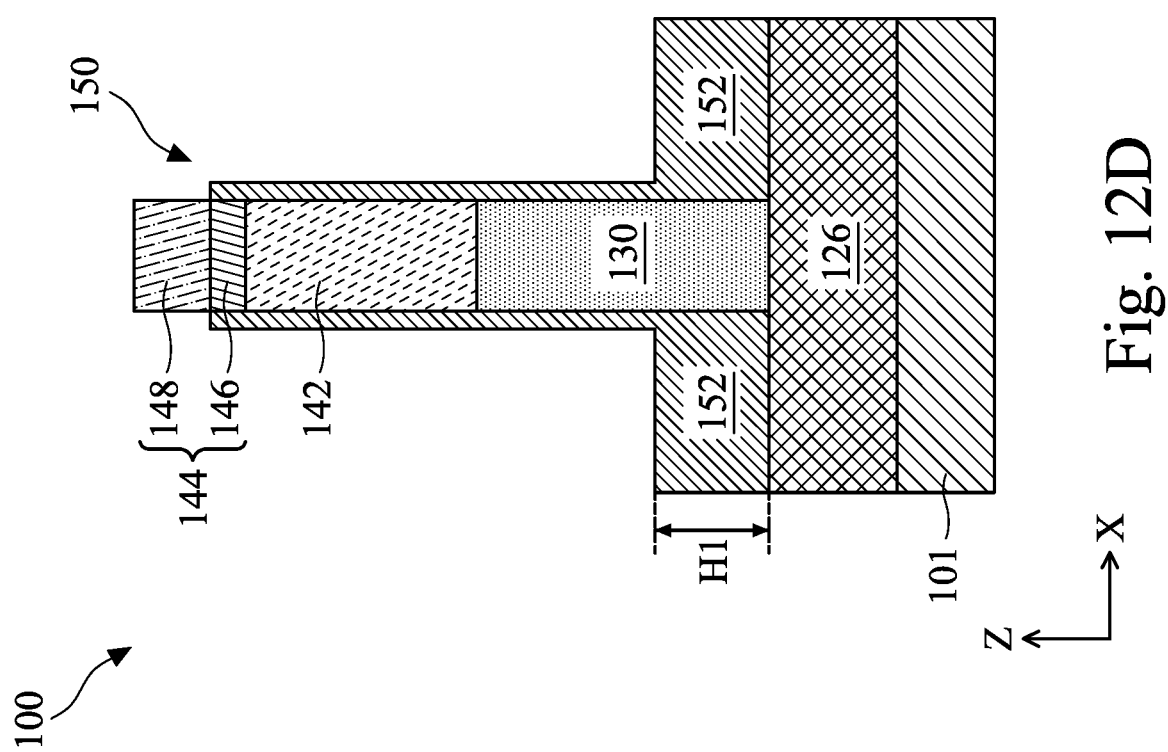
Figure 13A:
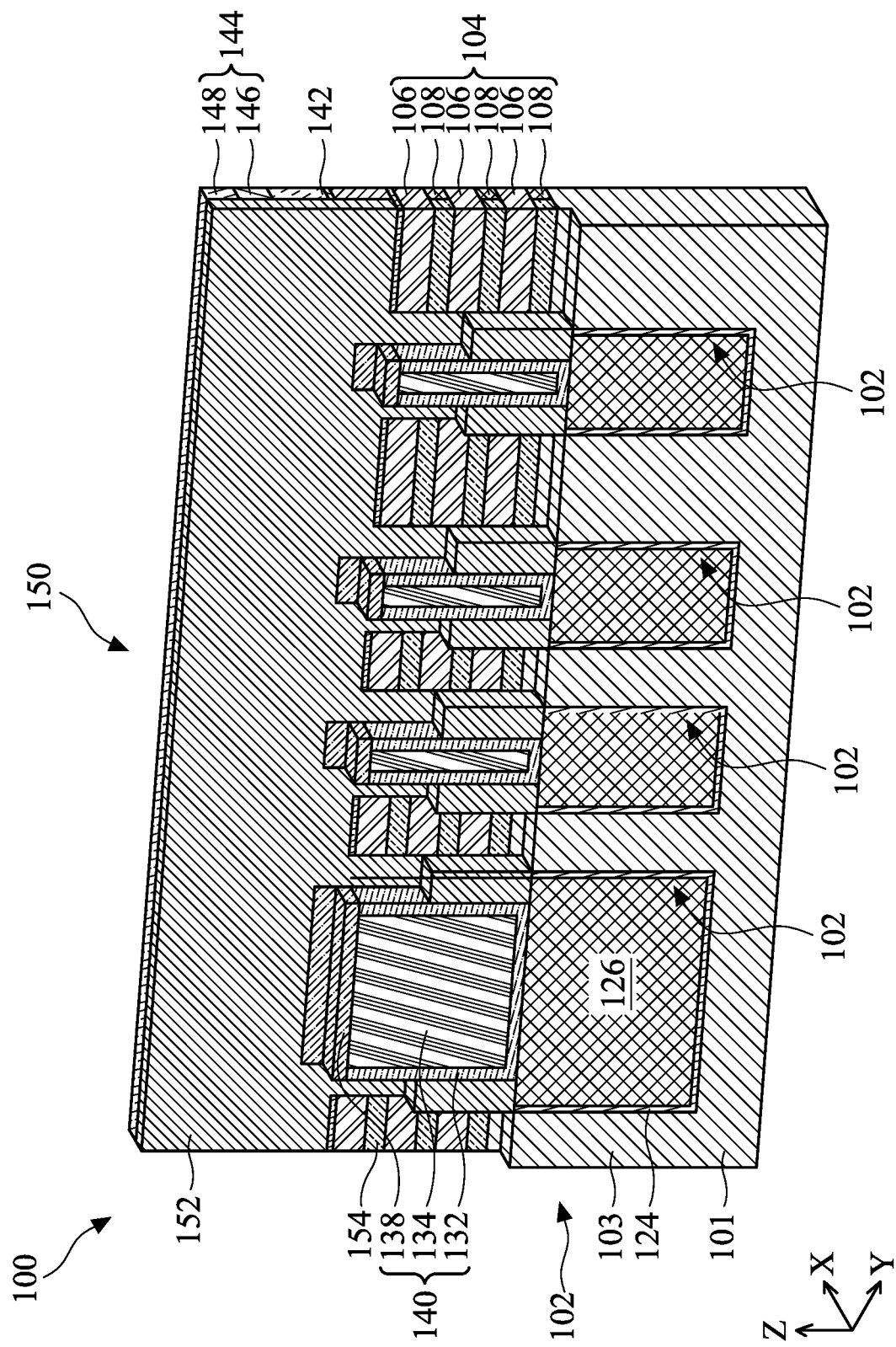
Figure 13C:
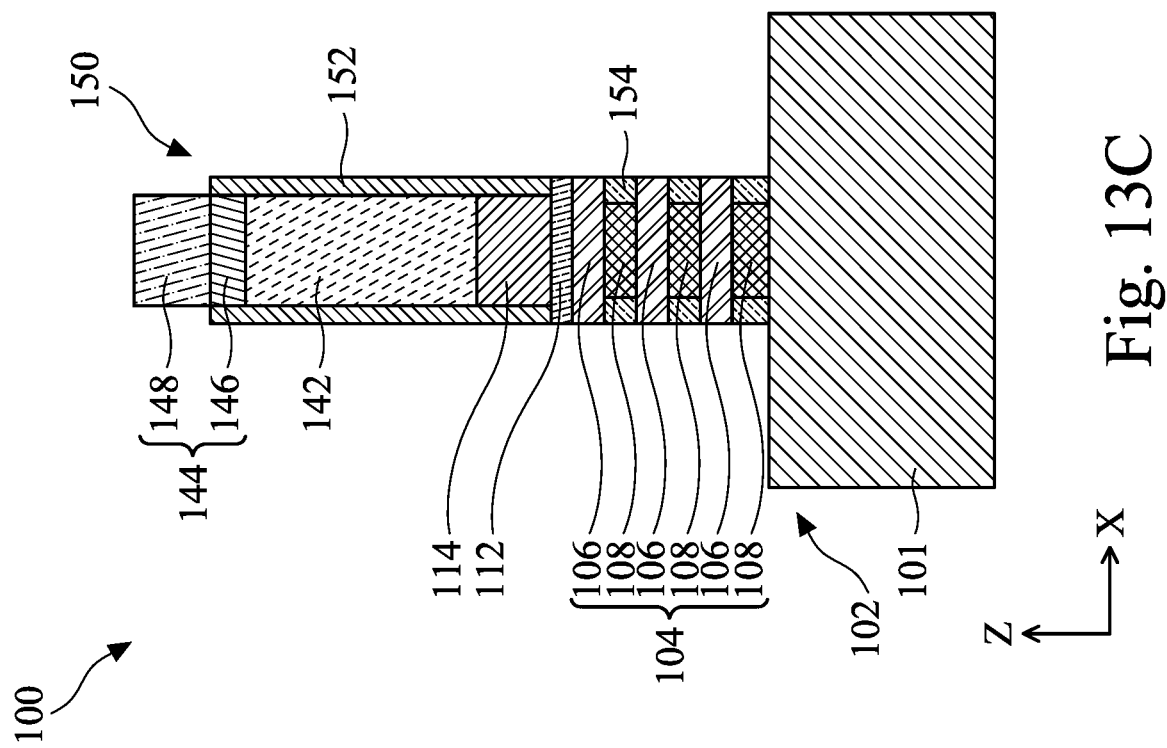
Figure 13B:
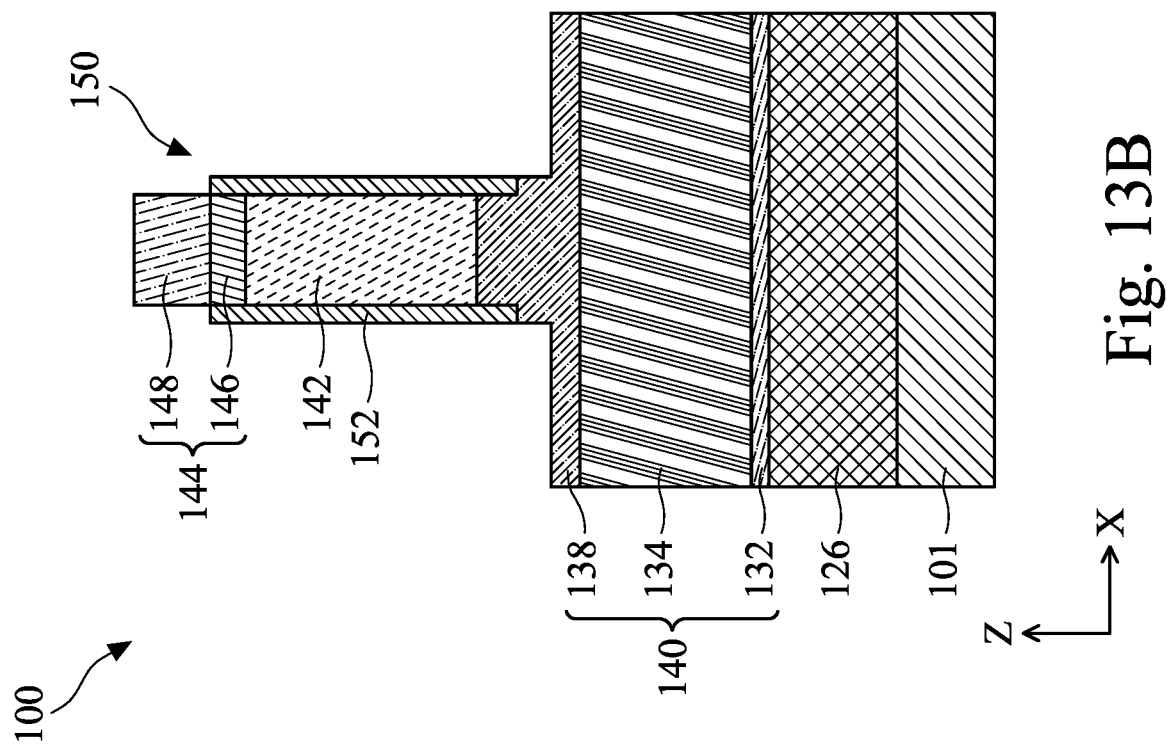
Figure 13D:
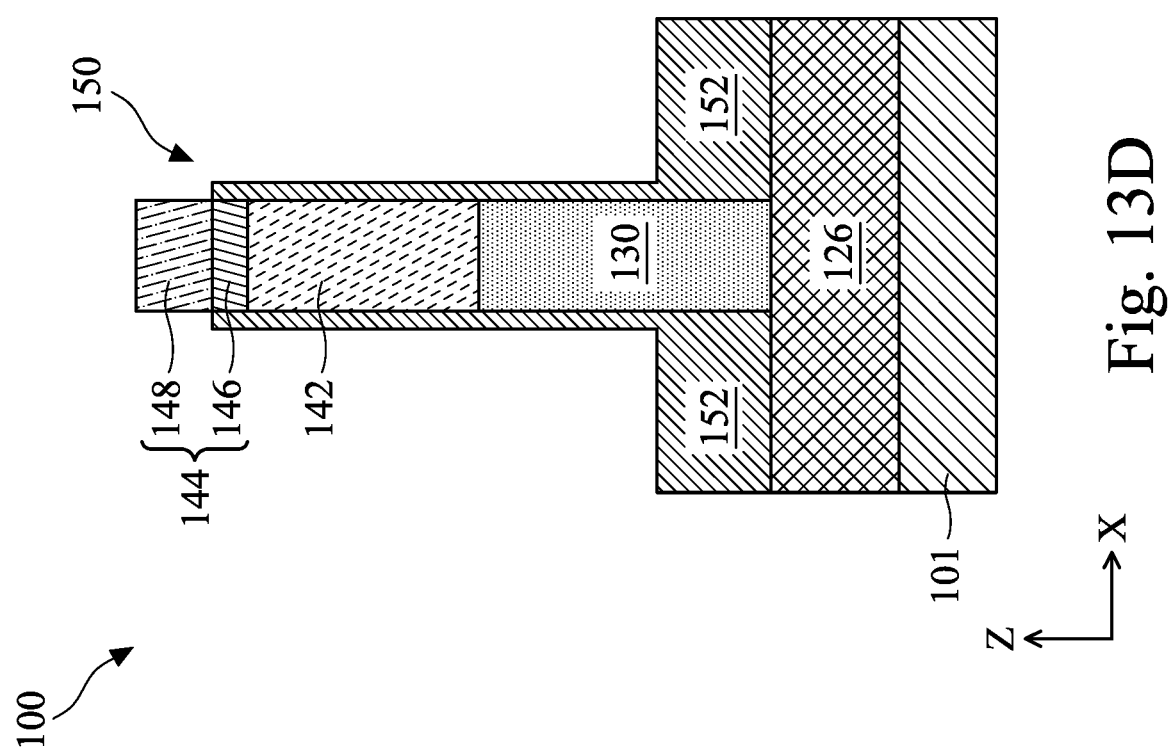

As shown in FIGS. 12A-12D, portions of the spacer 152, the oxide layer 112, and the stack of semiconductor layers 104 are removed or recessed. The removal or recess of materials may be performed by multiple etch processes. In some embodiments, a first etch process is performed to remove the portion of the spacer 152 formed on the oxide layer 112 and the high-K dielectric layer 138. The oxide layer 112 may be removed by the first etch process. As a result of the first etch process, the portions of the stack of semiconductor layers 104 and the high-K dielectric layer 138 not covered by the sacrificial gate stack 150 are exposed. The first etch process may be a selective etch process that removes the dielectric materials of the spacer 152 and the oxide layer 112, and the semiconductor material of the first semiconductor layer 106 and the high-K dielectric layer 138 are not substantially affected. The first etch process may be any suitable etch process, such as dry etch, wet etch, or a combination thereof. A second etch process may be performed to remove the exposed portions of the stack of semiconductor layers 104. The second etch process may be a selective etch process that removes the semiconductor materials of the stack of semiconductor layers 104. The spacer 152 and the high-K dielectric layer 138 may be also recessed during the second etch process. The second etch process may be any suitable etch process, such as dry etch, wet etch, or a combination thereof. In some embodiments, a third etch process is performed to recess the portion of the spacer 152 disposed in the gaps 151 (FIG. 10A) to a height H1, as shown in FIGS. 12A and 12D. In some embodiments, the height H1 ranges from about 10 nm to about 30 nm. The portion of the spacer 152 disposed in the gaps 151 (FIG. 10A) can constrain the S/D epitaxial features 156 (FIG. 14A), leading to improved total gate capacitance, gate-to-drain capacitance, cell capacitance, and speed at Vdd. If the height H1 is greater than about 30 nm, the area of the S/D epitaxial features 156 (FIG. 14A) to contact a conductive feature 178 (FIG. 20B) may be reduced, leading to increased contact resistance. On the other hand, if the height H1 is less than about 10 nm, the portion of the spacer 152 disposed in the gaps 151 (FIG. 10A) may not constrain the S/D epitaxial features 156 (FIG. 14A) enough to obtain the improvements in capacitances and speed. In some embodiments, the total thickness of the stack of semiconductor layers 104 is a height H2, and the height H1 is about 20 percent to about 75 percent of the height H2. Similarly, if the height H1 is less than about 20 percent of the height H2, the portion of the spacer 152 disposed in the gaps 151 (FIG. 10A) may not constrain the S/D epitaxial features 156 (FIG. 14A) enough to obtain the improvements in capacitances and speed. On the other hand, if the height H1 is more than about 75 percent of the height H2, contact resistance may be increased.

As described above, the exposed portion of the high-K dielectric layer 138 may be recessed during the first, second, and/or third etch process, as shown in FIGS. 12A and 12B. Thus, the high-K dielectric layer 138 includes a first portion having a height less than a height of the second portion, as shown in FIGS. 12A and 12B. The first portion of the high-K dielectric layer 138 may be located between subsequently formed S/D epitaxial features 156 (FIG. 14A), and the second portion of the high-K dielectric layer 138 under the sacrificial gate stack 150 may be located between channel regions.

At this stage, end portions of the stack of semiconductor layers 104 under the sacrificial gate stack 150 have substantially flat surfaces which may be flush with the spacer 152, as shown in FIGS. 12A and 12C. In some embodiments, the end portions of the stack of semiconductor layers 104 under the sacrificial gate stack 150 are slightly horizontally etched.

As shown in FIGS. 13A-13D, the edge portions of each second semiconductor layer 108 are removed, and inner spacers 154 are formed in the space created by the removal of the edge portions of the second semiconductor layer 108. In some embodiments, the portions of the second semiconductor layers 108 are removed by a selective wet etching process that does not remove the first semiconductor layers 106. For example, in cases where the second semiconductor layers 108 are made of SiGe, and the first semiconductor layers 106 are made of silicon, a selective wet etching including an ammonia and hydrogen peroxide mixtures (APM) may be used. The wet etch process does not substantially affect the dielectric materials of the spacer 152, the high-K dielectric layer 138, and the nitrogen-containing layer 148. The inner spacers 154 may be made of a dielectric material, such as SiON, SiCN, SiOC, SiOCN, or SiN. In some embodiments, the inner spacers 154 may be formed by first forming a conformal dielectric layer using a conformal deposition process, such as ALD, followed by an anisotropic etching to remove portions of the conformal dielectric layer other than the inner spacers 154. The inner spacers 154 may be protected by the first semiconductor layers 106 during the anisotropic etching process. The inner spacers 154 may include a material different from the material of the spacer 152, so the spacer 152 is not substantially affected during the anisotropic etching process. In some embodiments, the inner spacers 154 include the same material as the spacer 152.

Figure 14A:
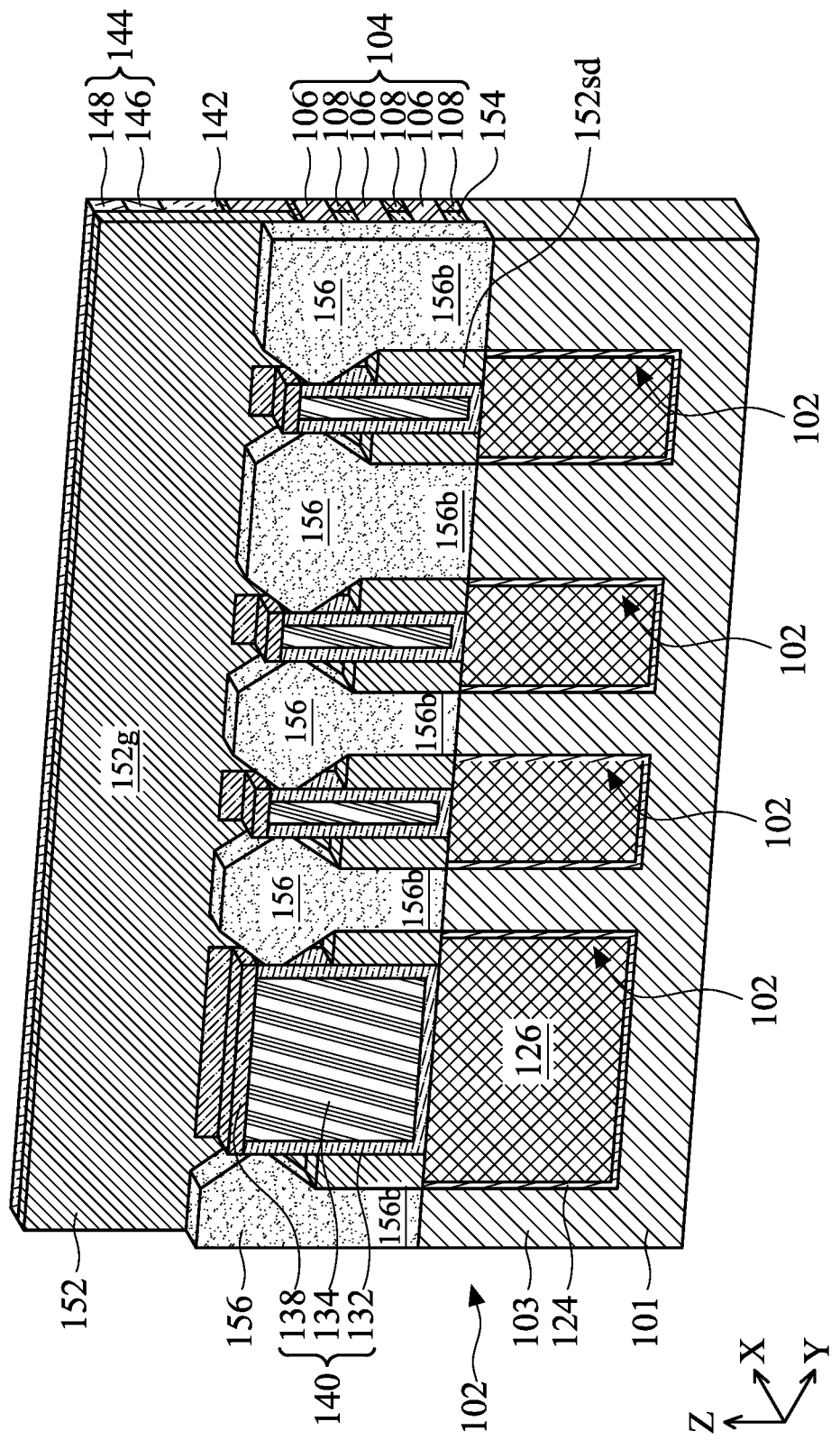

As shown in FIGS. 14A-14D, S/D epitaxial features 156 are formed on the substrate portions 103 of the fins 102. The S/D epitaxial feature 156 may include one or more layers of Si, SiP, SiC and SiCP for an n-channel FET or Si, SiGe, Ge for a p-channel FET. The S/D epitaxial features 156 may grow both vertically and horizontally to form facets, which may correspond to crystalline planes of the material used for the substrate portions 103. The S/D epitaxial features 156 are formed by an epitaxial growth method using CVD, ALD or MBE. As shown in FIGS. 14A-14D, the spacer 152 includes gate spacer portion 152g and S/D spacer portions 152sd. The S/D spacer portions 152sd extend from the gate spacer portion 152g. Because of the existence of the S/D spacer portions 152sd of the spacer 152, a bottom portion 156b of each S/D epitaxial feature 156 is constrained, as shown in FIG. 14A. Instead of forming multiple facets, the bottom portion 156b of each S/D epitaxial feature 156 has substantially straight sidewalls, which are in contact with and constrained by the S/D spacer portions 152sd. As described above, the constrained S/D epitaxial features 156 caused by the S/D spacer portion 152sd having the height H1 can improve capacitances and speed while avoiding increase in contact resistance.

Figure 14C:
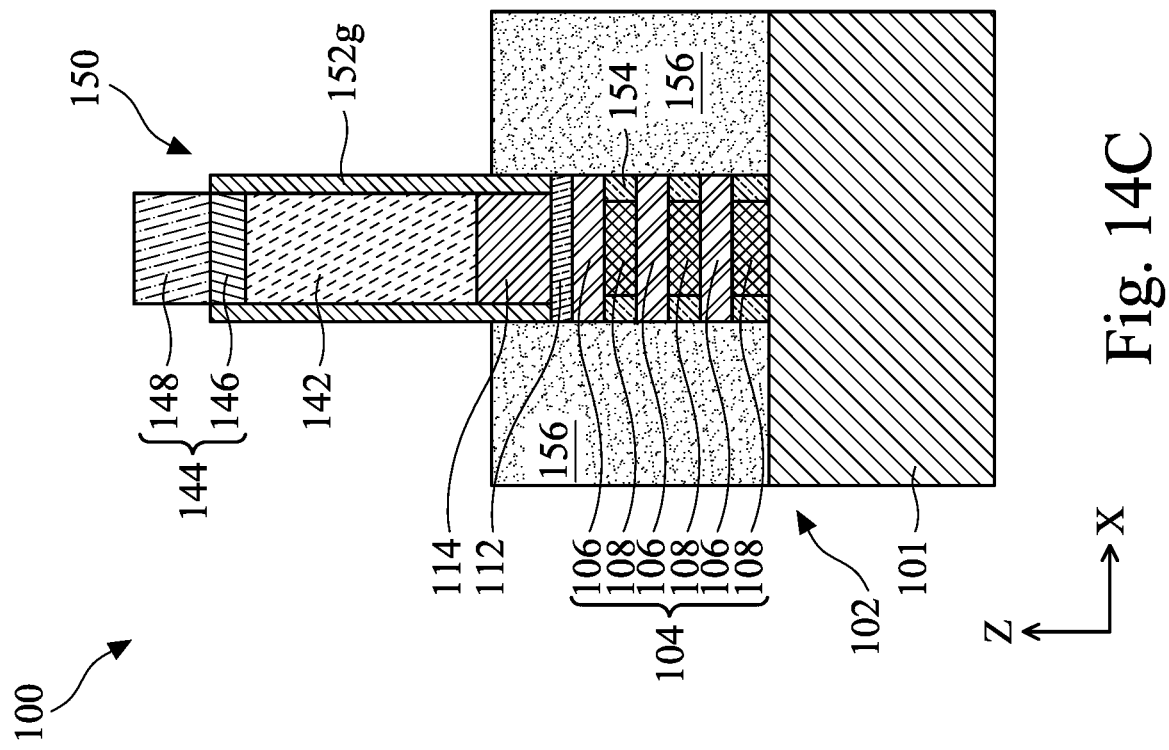

The S/D epitaxial features 156 are in contact with the first semiconductor layers 106 and the inner spacers 154, as shown in FIG. 14C. The S/D epitaxial features 156 may be the S/D regions. For example, one of a pair of S/D epitaxial features 156 located on one side of the stack of semiconductor layers 104 is a source region, and the other of the pair of S/D epitaxial features 156 located on the other side of the stack of semiconductor layers 104 is a drain region, as shown in FIG. 14C. A pair of S/D epitaxial features 156 is referring to a source epitaxial feature 156 and a drain epitaxial feature 156 connected by the channels (i.e., the first semiconductor layers 106). In this disclosure, a source and a drain are interchangeably used, and the structures thereof are substantially the same.

As shown in FIGS. 15A-15D, a contact etch stop layer (CESL) 158 may be formed on the S/D epitaxial features 156, the dielectric features 140, and the sacrificial gate stacks 150. The CESL 158 may include an oxygen-containing material or a nitrogen-containing material, such as silicon nitride, silicon carbon nitride, silicon oxynitride, carbon nitride, silicon oxide, silicon carbon oxide, or the like, or a combination thereof. The CESL 158 may be formed by CVD, PECVD, ALD, or any suitable deposition technique. In some embodiments, the CESL 158 is a conformal layer formed by the ALD process. An interlayer dielectric (ILD) layer 160 may be formed on the CESL 2102. The materials for the ILD layer 160 may include oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 160 may be deposited by a PECVD process or other suitable deposition technique. In some embodiments, after formation of the ILD layer 160, the semiconductor device structure 100 may be subject to a thermal process to anneal the ILD layer 160.

Figure 14B:
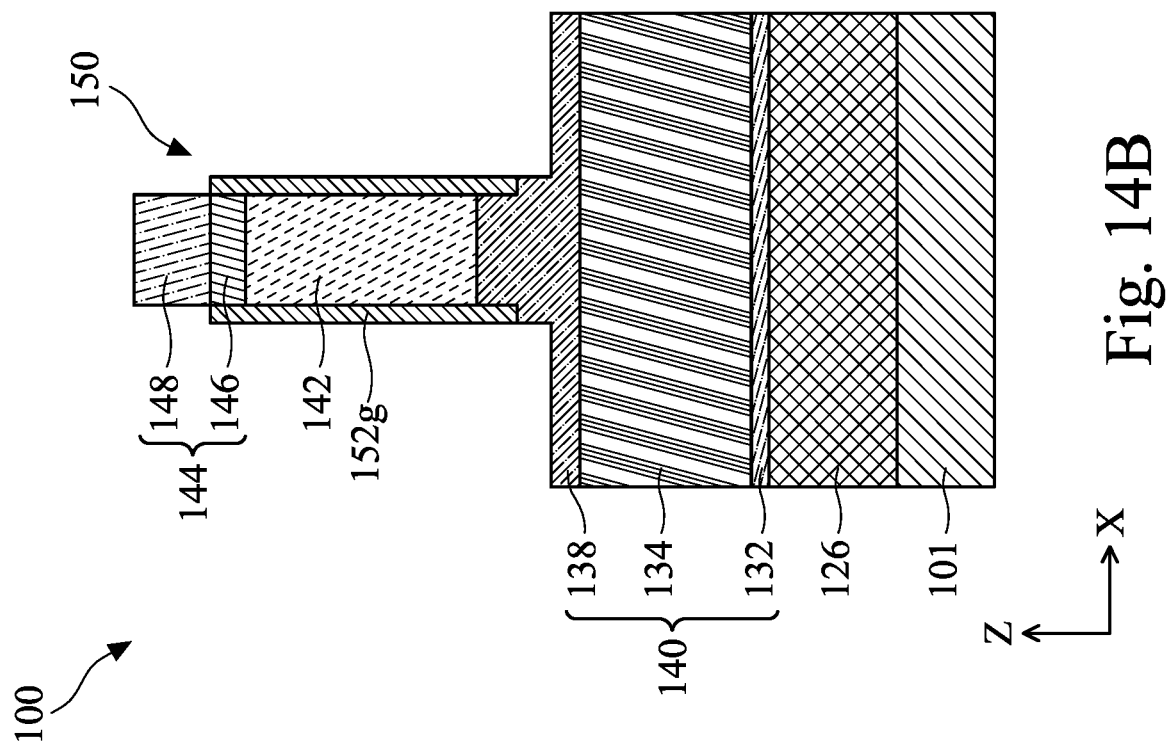
Figure 14D:
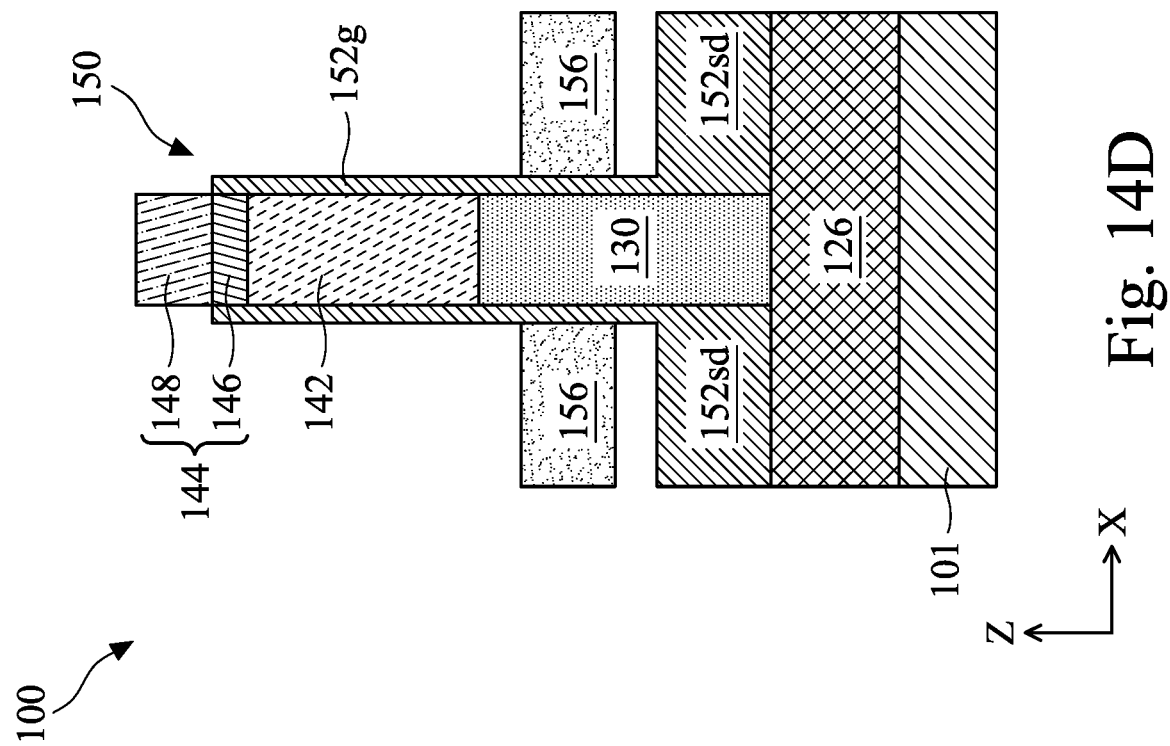
Figure 15A:
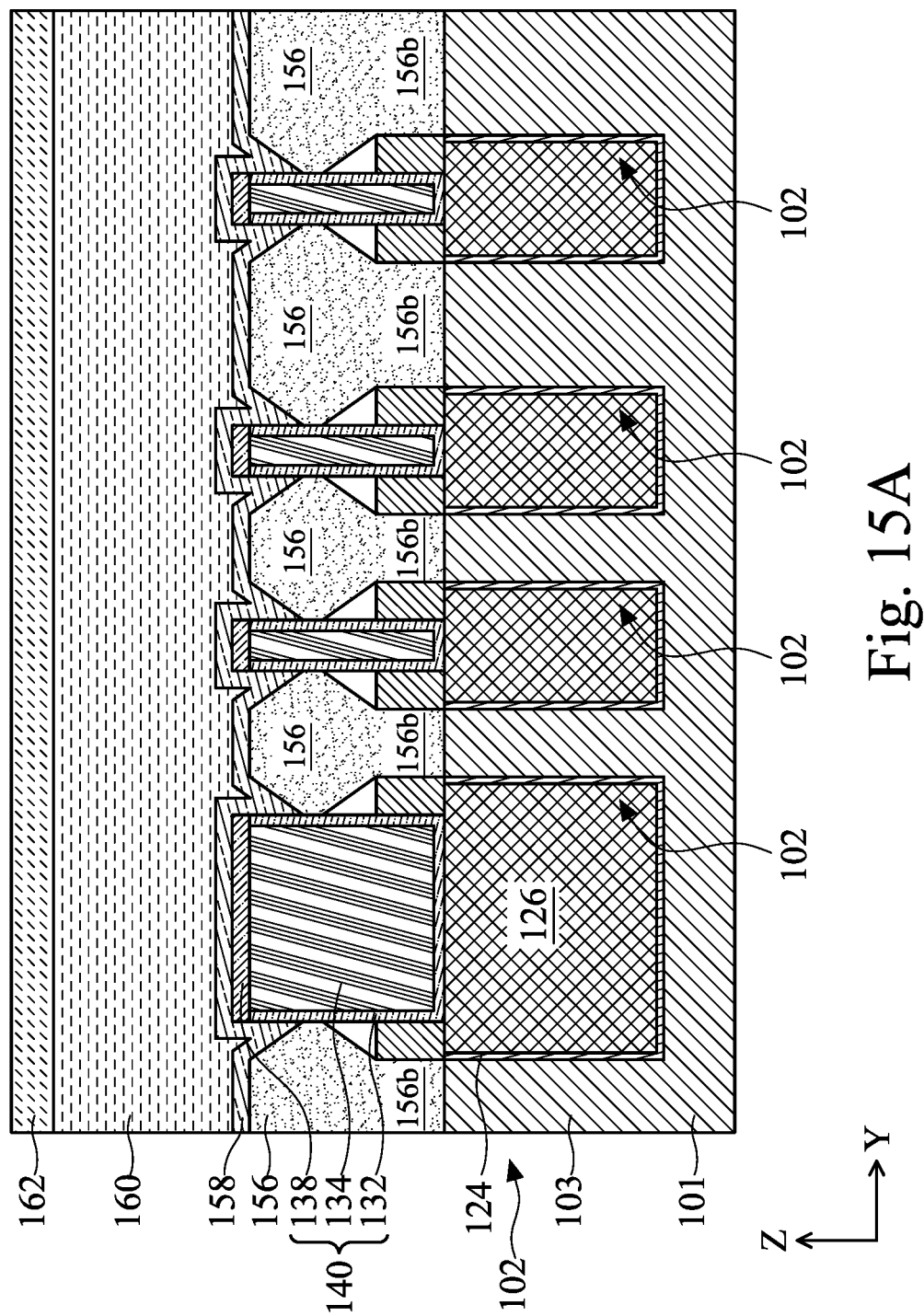
FIGS. 15A-15D are cross-sectional side views of one of various stages of manufacturing the semiconductor device structure, in accordance with some embodiments.
Figure 15C:
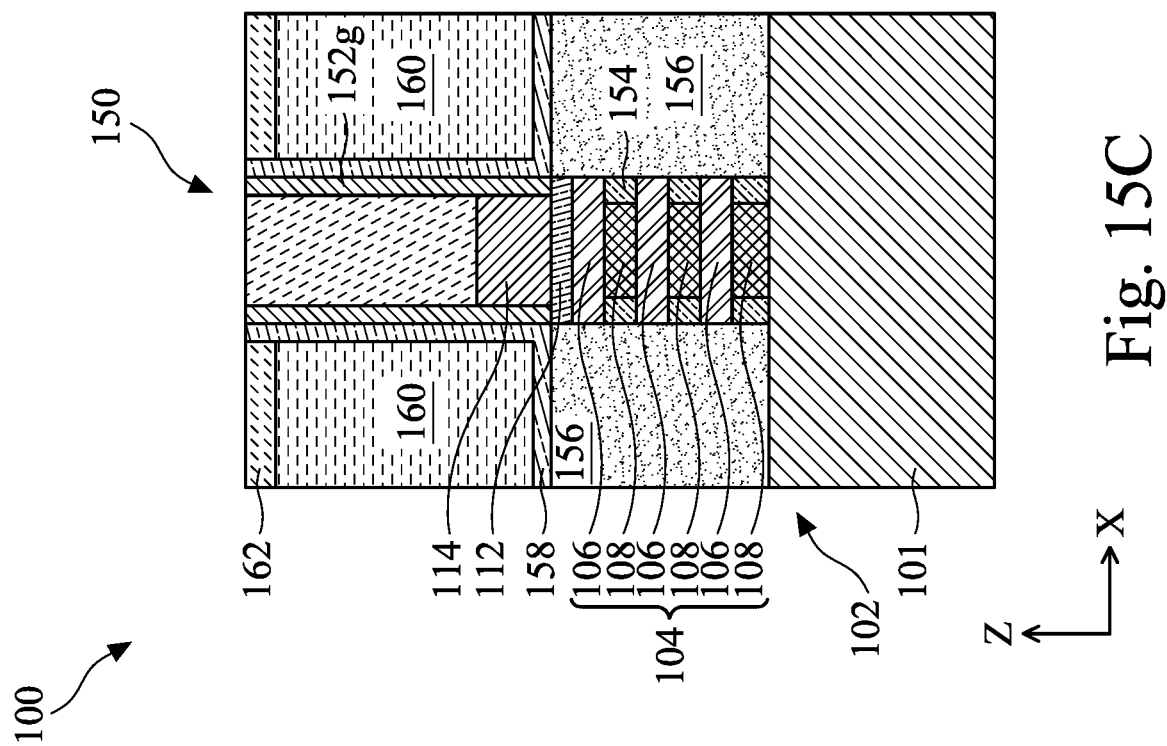
Figure 15B:
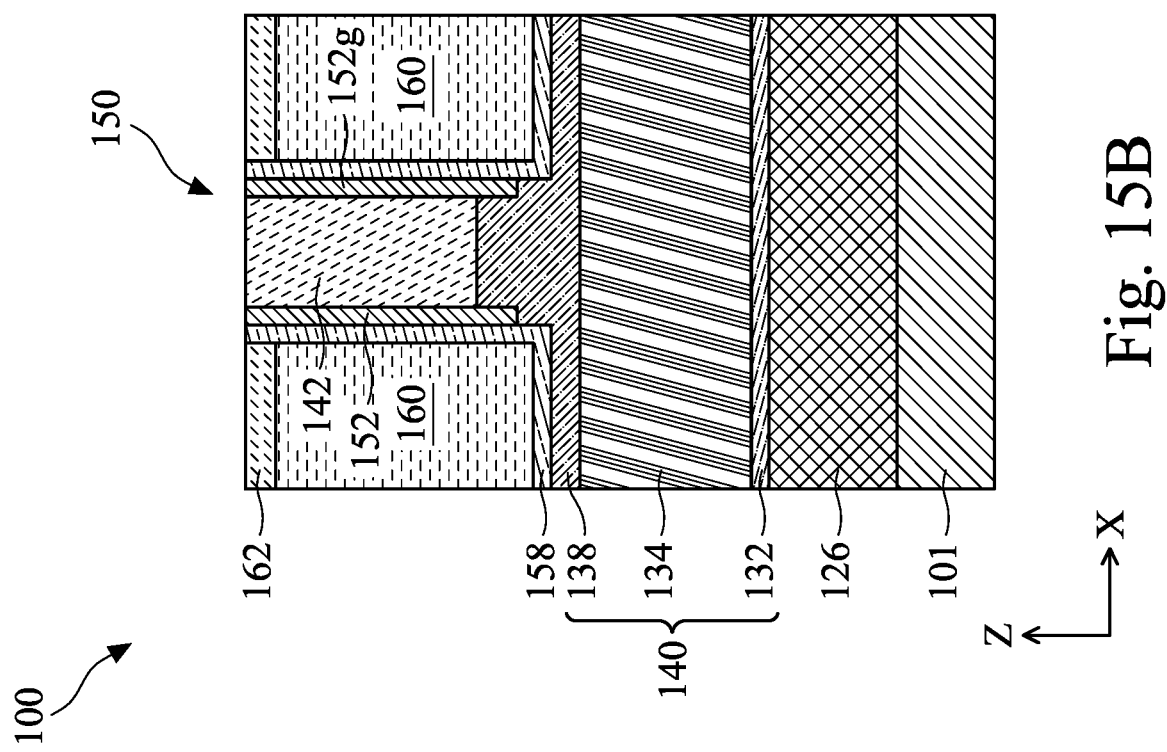
Figure 15D:
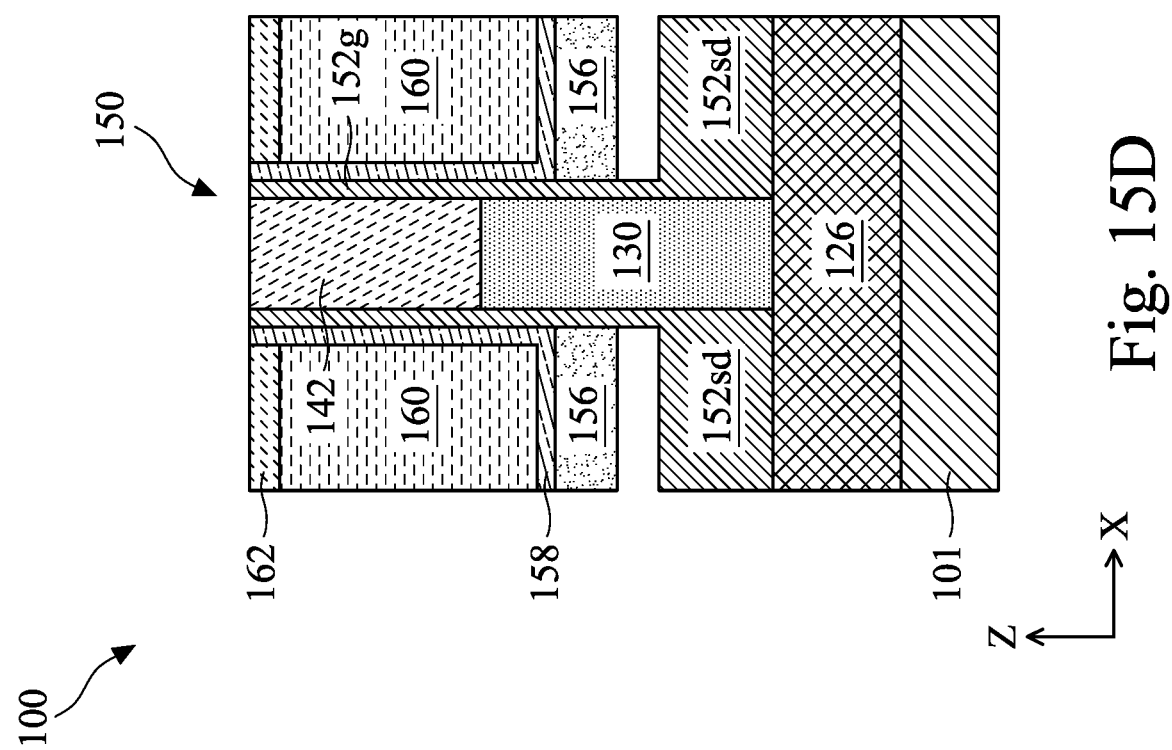

A planarization process is performed to expose the sacrificial gate electrode layer 142, as shown in FIGS. 15B-15D. The planarization process may be any suitable process, such as a CMP process. The planarization process removes portions of the ILD layer 160 and the CESL 158 disposed on the sacrificial gate stacks 150. The planarization process may also remove the mask structure 144 (FIG. 14B). The ILD layer 160 may be recessed to a level below the top of the sacrificial gate electrode layer 142, and a nitrogen-containing layer 162, such as a SiCN layer, may be formed on the recessed ILD layer 160, as shown in FIGS. 15A-15D. The nitrogen-containing layer 162 may protect the ILD layer 160 during subsequent etch processes.

FIGS. 16A-18A are perspective views of various stages of manufacturing the semiconductor device structure 100, in accordance with some embodiments. FIGS. 16B-18B are cross-sectional side views of various stages of manufacturing the semiconductor device structure 100 taken along line B-B of FIG. 16A, in accordance with some embodiments. FIGS. 16C-18C are cross-sectional side views of various stages of manufacturing the semiconductor device structure 100 taken along line C-C of FIG. 16A, in accordance with some embodiments.

Figure 16A:
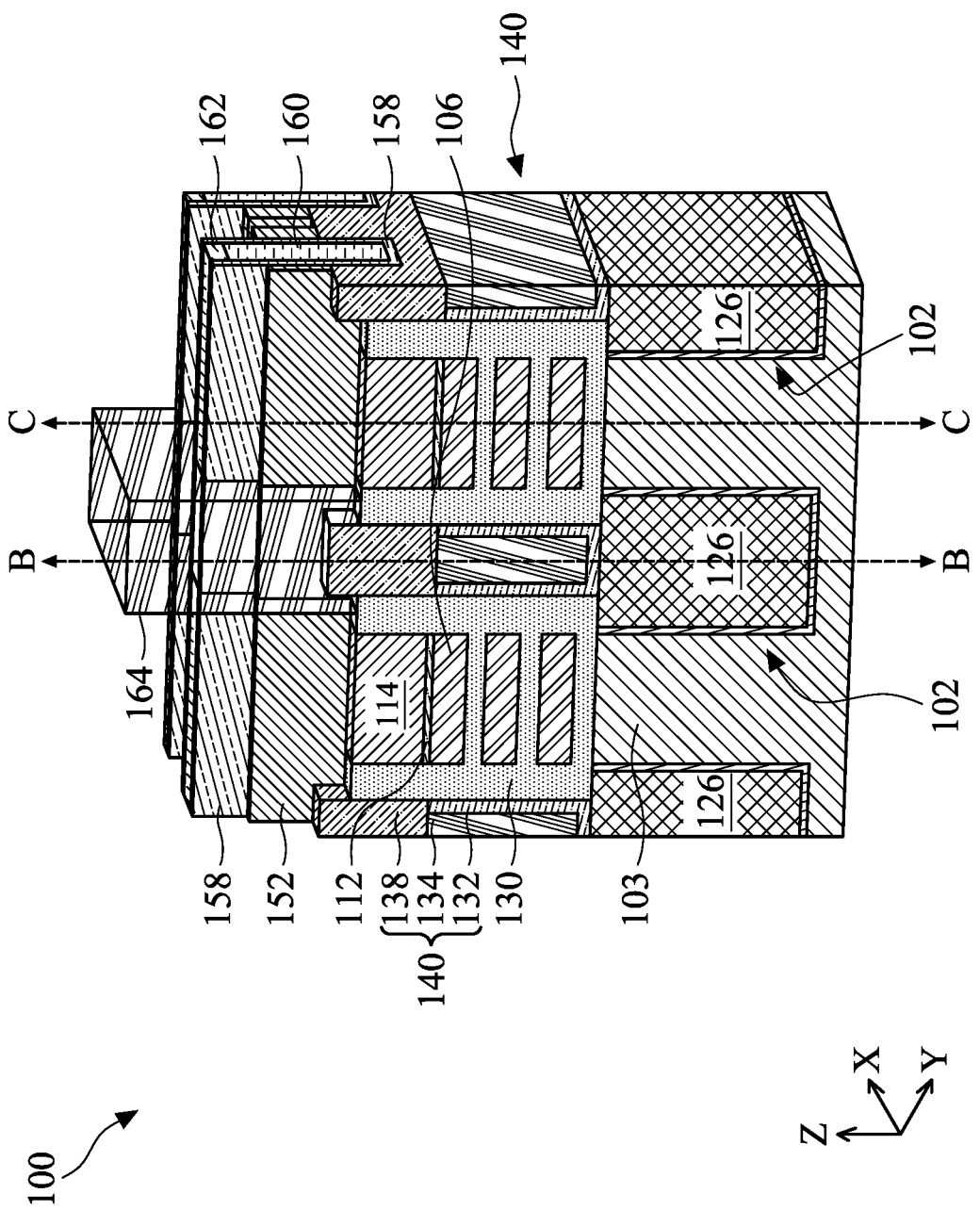
Figure 16B:
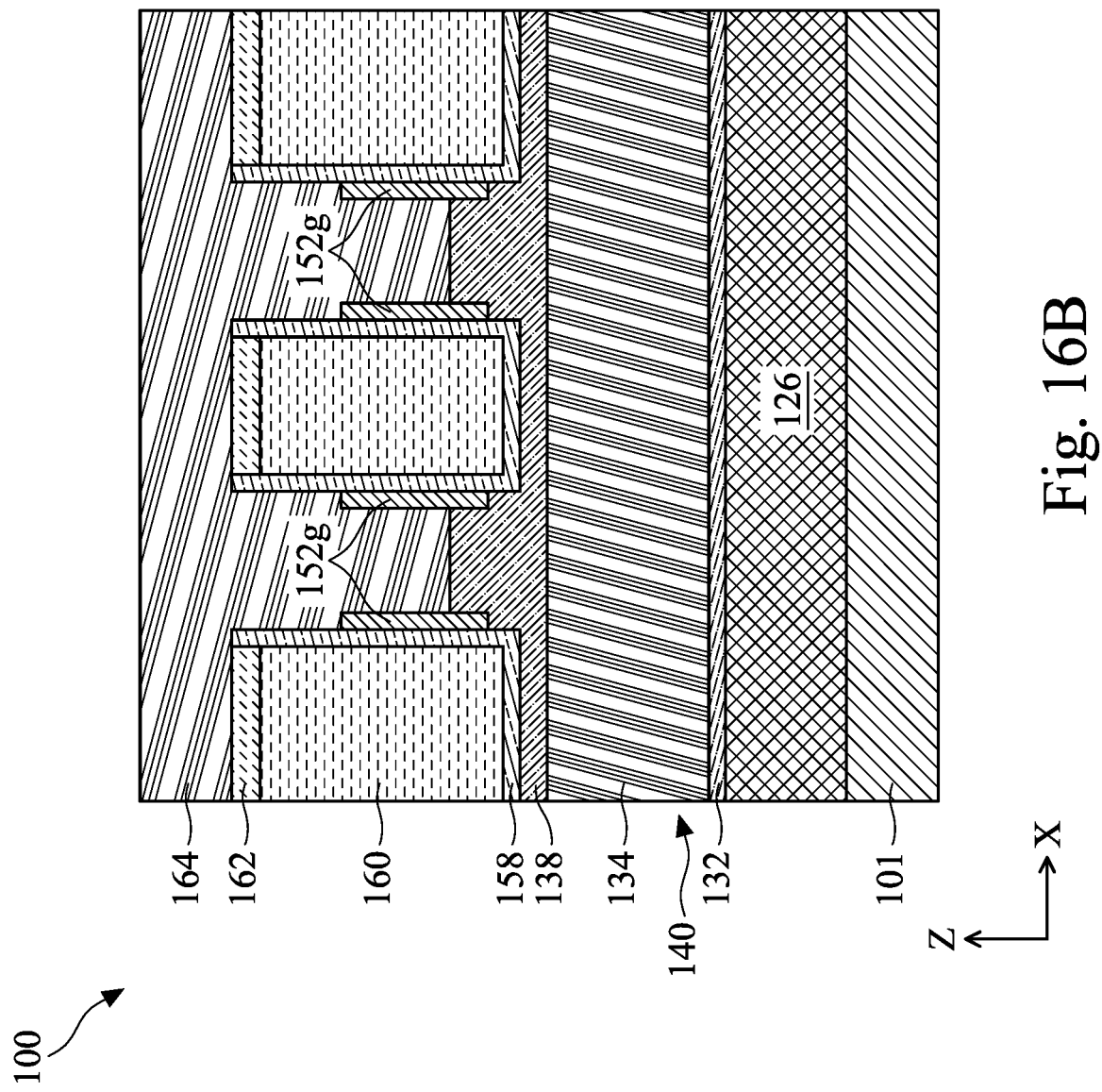
Figure 16C:
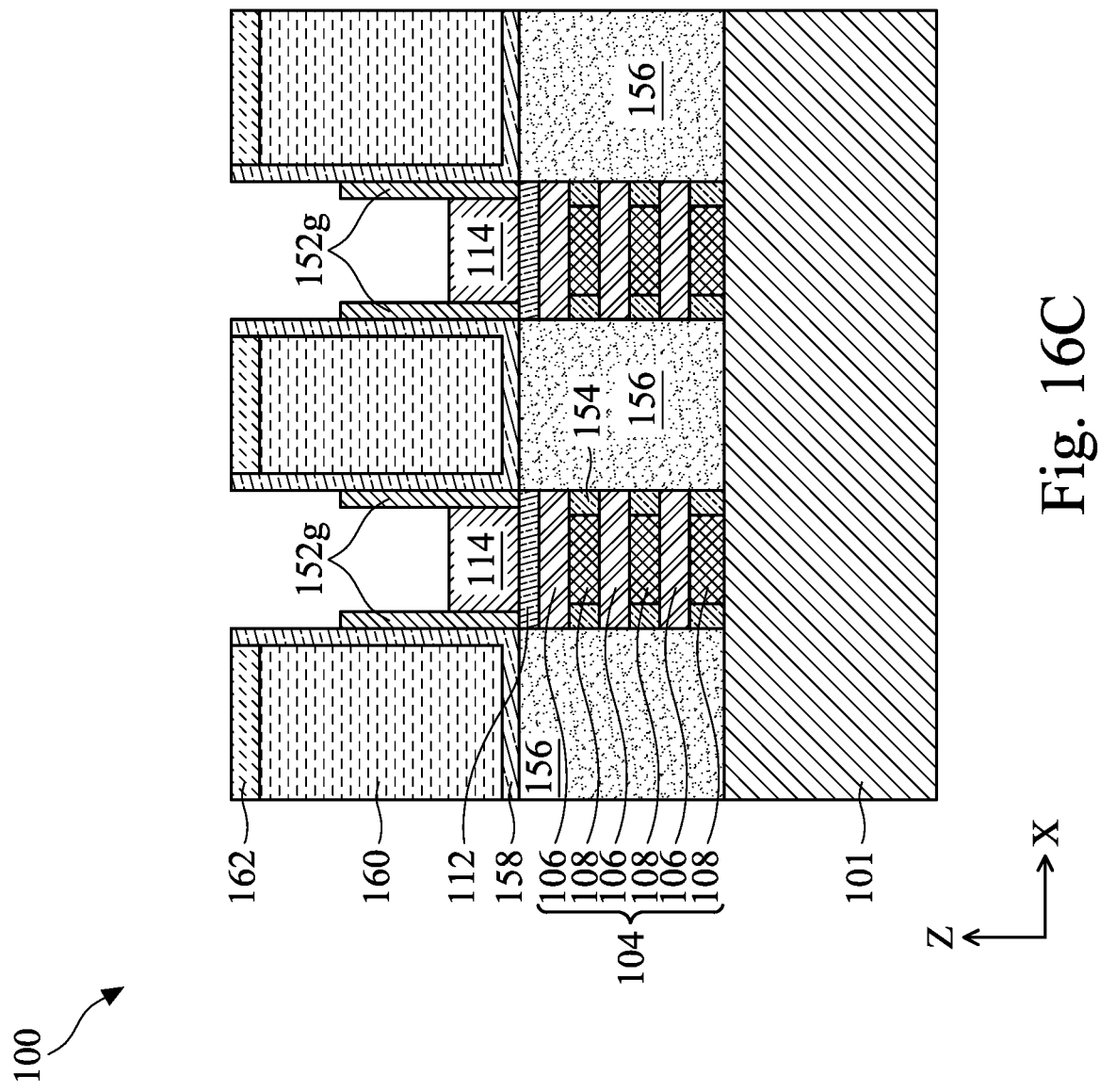

FIG. 16A shows a portion of the channel region of the semiconductor device structure 100. After the formation of the CESL 158, the ILD layer 160, and the nitrogen-containing layer 162, the sacrificial gate electrode layers 142 are removed, as shown in FIGS. 16A-16C. The sacrificial gate electrode layers 142 may be removed by any suitable process, such as dry etch, wet etch, or a combination thereof. In some embodiments, a wet etchant such as a tetramethylammonium hydroxide (TMAH) solution can be used to selectively remove the sacrificial gate electrode layer 1504 but not the nitrogen-containing layer 162 and the CESL 158. In some embodiments, a portion of the gate spacer portion 152g may be removed by the etch process that removes the sacrificial gate electrode layers 142, as shown in FIGS. 16A-16C. In some embodiments, the portion of the gate spacer portion 152g may be removed by a different etch process. In some embodiments, the etch process is controlled so that the semiconductor layer 114 and the cladding layer 130 are not substantially affected.

As shown in FIGS. 16A and 16B, a mask 164 is formed on a portion of the exposed portions of the high-K dielectric layer 138, and the mask 164 may extend along the X direction, which also covers a portion of the spacer 152, the CESL 158, and the nitrogen-containing layer 162. The mask 164 may be formed by first forming a blanket layer on the semiconductor device structure 100, followed by patterning and etching processes to remove portions of the blanket layer to form the mask 164. The mask 164 may include an oxygen-containing material and/or a nitrogen-containing material. In some embodiments, the mask 164 is a photoresist formed by first forming a blanket photoresist layer on the semiconductor device structure 100, followed by patterning the photoresist to form the mask 164.

The mask 164 may be formed over one or more of the portions of the high-K dielectric layer 138 disposed in the channel region not covered by the ILD layer 160. The mask 164 protects the one or more of the portions of the high-K dielectric layer 138 in order to keep the protected portions of the high-K dielectric layer 138 to separate the subsequently formed gate electrode layer 172 (FIG. 19). The unprotected portions of the high-K dielectric layer 138 may be removed, leading to the subsequently formed gate electrode layer 172 (FIG. 19) connecting adjacent channel regions. In other words, if it is predetermined that the gate electrode layers 172 (FIG. 19) in adjacent channel regions should be separated, or cut-off, the mask 164 is formed on the portion of the high-K dielectric layer 138 of the dielectric feature 140 formed between the adjacent channel regions. On the other hand, if it is predetermined that the gate electrode layers 172 (FIG. 19) in adjacent channel regions should be connected, the mask 164 is not formed on the portion of the high-K dielectric layer 138 of the dielectric feature 140 formed between the adjacent channel regions.

Figure 17A:
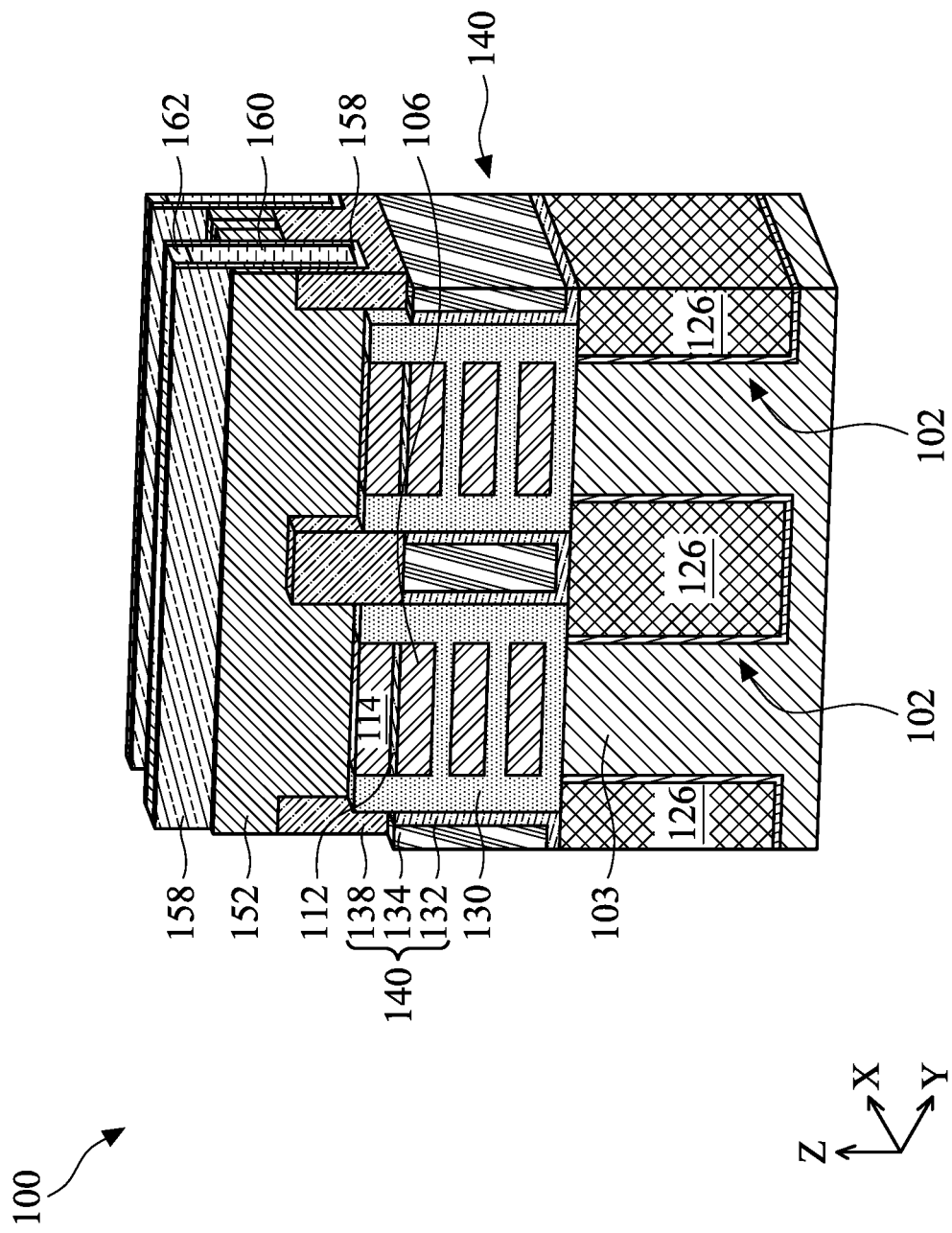
Figure 17B:
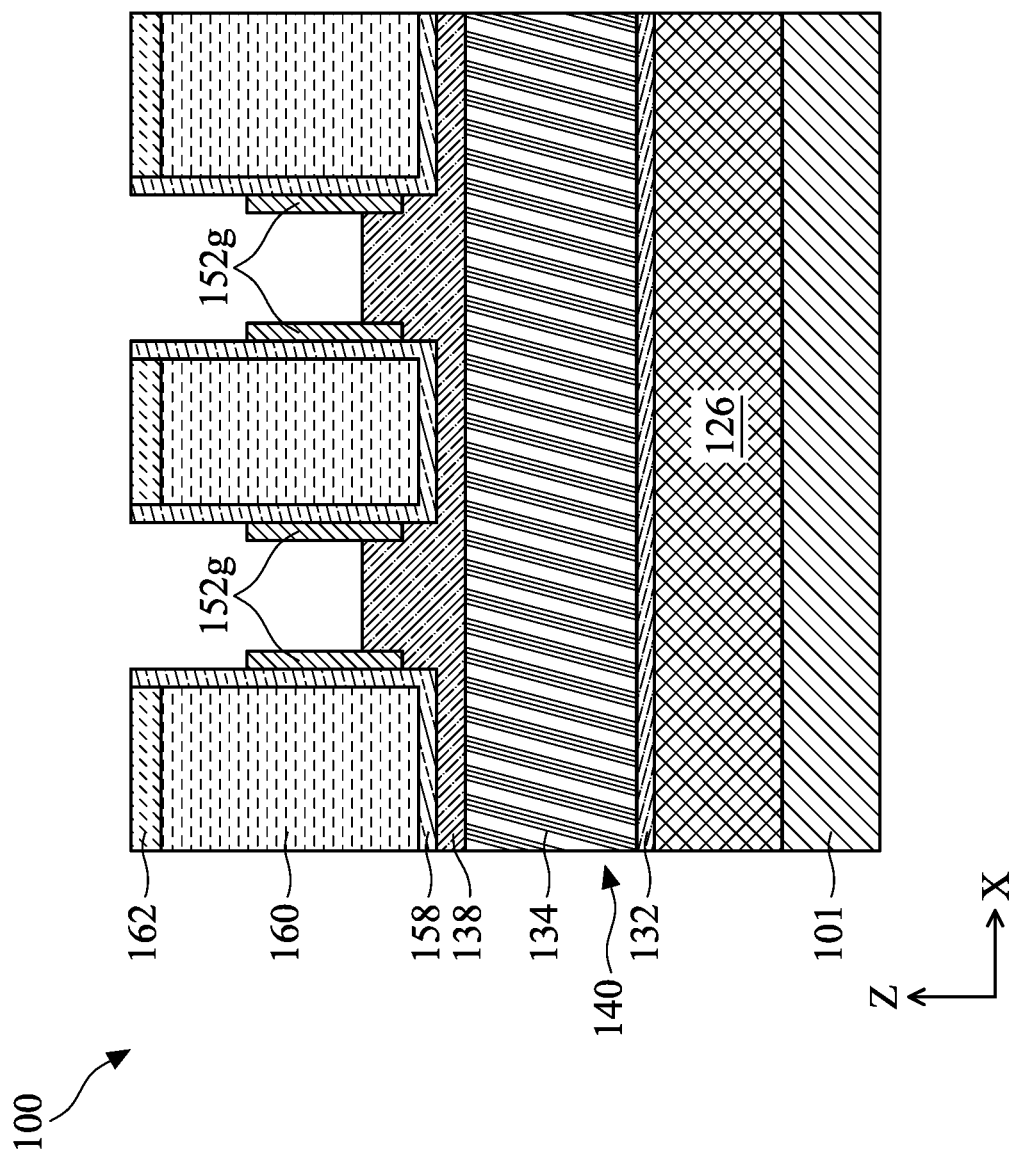
Figure 17C:
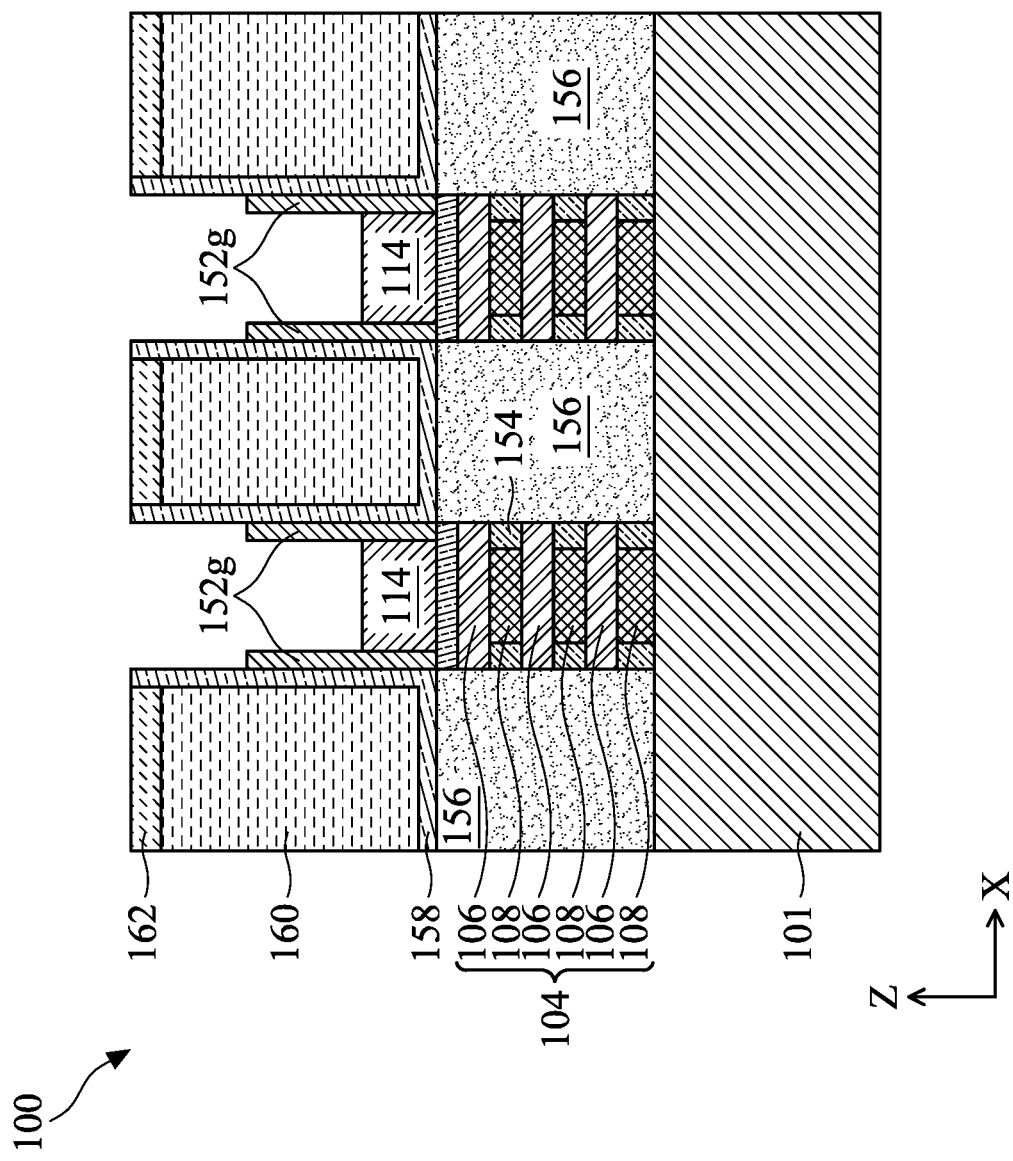

As shown in FIGS. 17A-17C, the portions of the high-K dielectric layer 138 not protected by the mask 164 may be removed. The portions of the high-K dielectric layer 138 under the ILD layer 160 are not removed. The removal of the portions of the portions of the high-K dielectric layer 138 may expose portions of the liner 132 and dielectric material 134 disposed therebelow, as shown in FIG. 17A. The removal process may be any suitable processes, such as dry etch, wet etch, or a combination thereof. The removal process does not remove the nitrogen-containing layer 162, the CESL 158, and the spacers 152. The semiconductor layer 114 and the cladding layer 130 may or may not be recessed during the removal of the portions of the high-K dielectric layer 138. After the removal of the portions of the high-K dielectric layer 138, the mask 164 (FIGS. 16A and 16B) may be removed. The mask 164 may be removed by any suitable removal process, such as ashing, dry etch, wet etch, or a combination thereof.

Figure 18A:
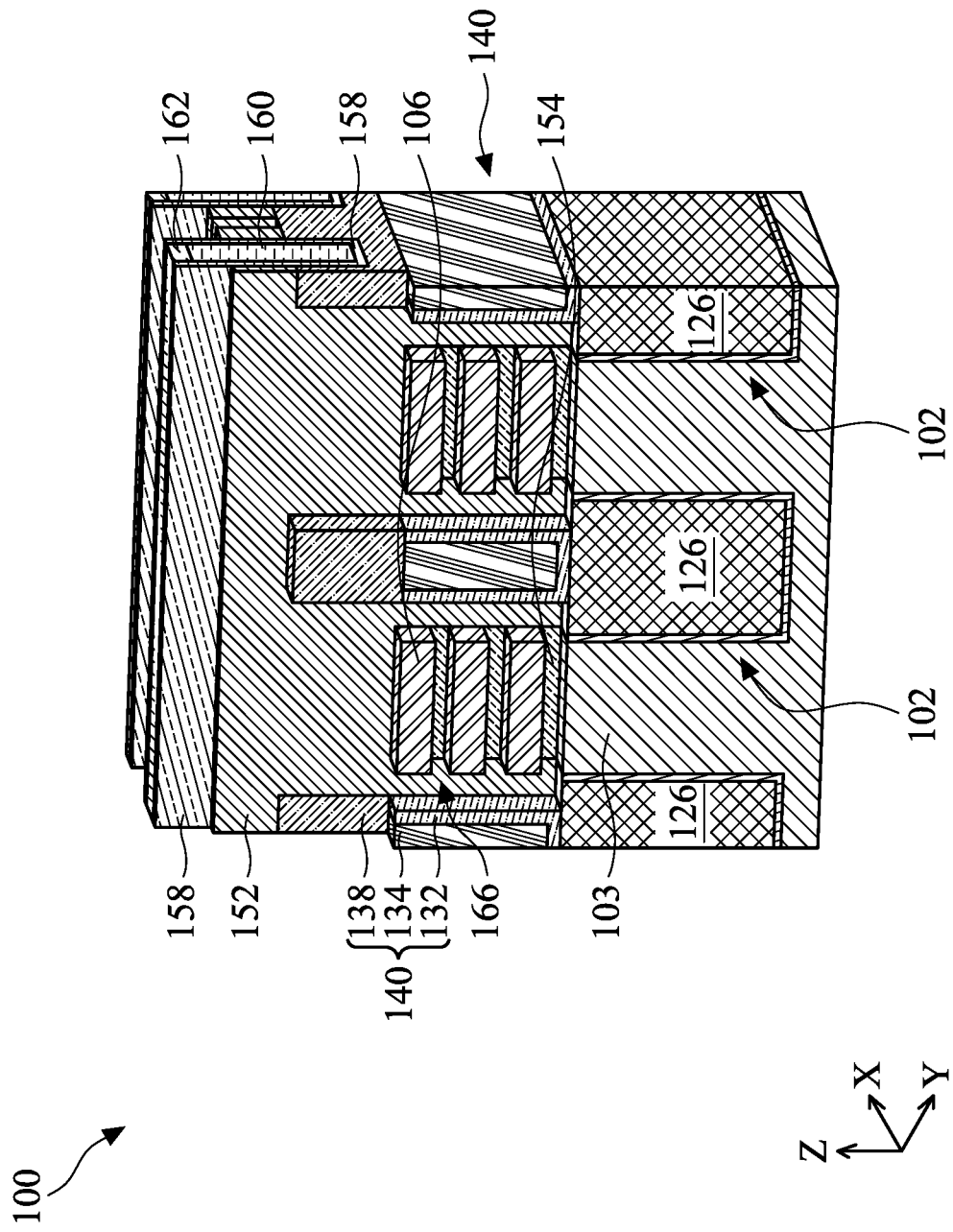
Figure 18B:
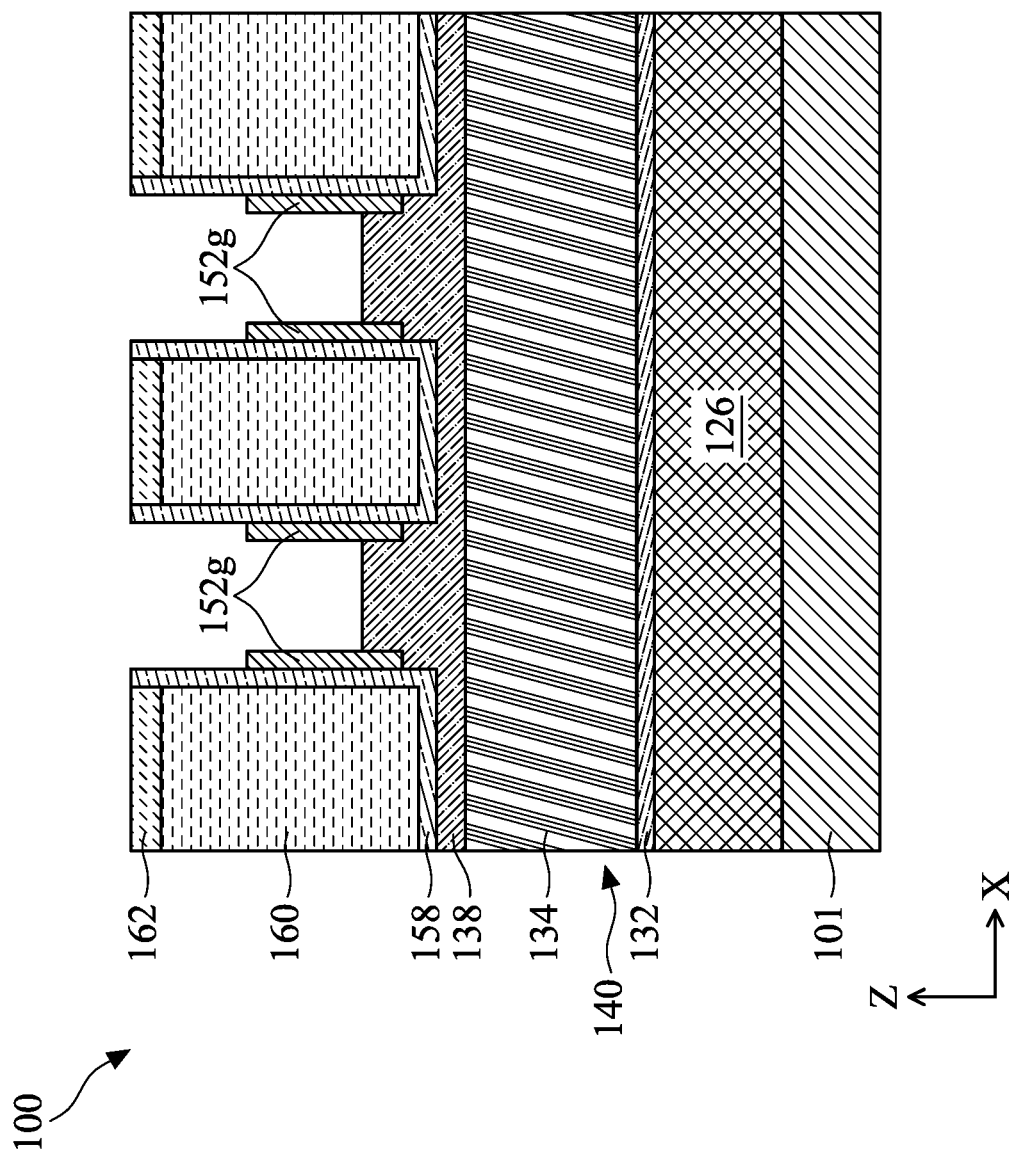
Figure 18C:
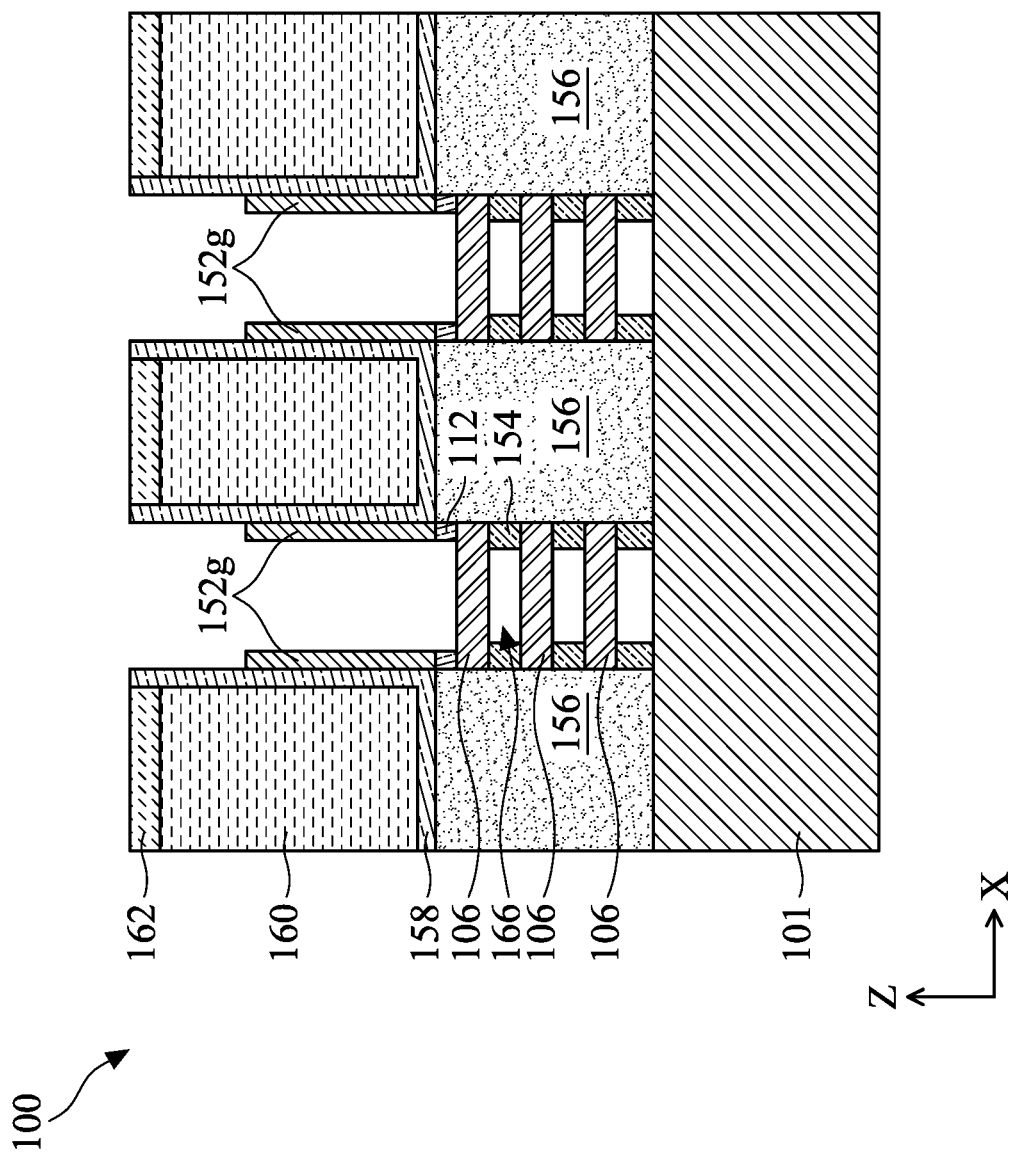

As shown in FIGS. 18A-18C, the cladding layers 130 and the second semiconductor layers 108 are removed. In some embodiments, the exposed portions of the oxide layer 112 are also removed. The removal process exposes the inner spacers 154 and the first semiconductor layers 106, as shown in FIGS. 18A and 18C. The removal process may be any suitable processes, such as dry etch, wet etch, or a combination thereof. In some embodiments, an etch process may be performed to remove the cladding layers 130, the second semiconductor layers 108, and the exposed portions of the oxide layer 112. The etch process may be a selective etch process that does not substantially affect the high-K dielectric layer 138, the spacer 152, the liner 132, the dielectric material 134, and the nitrogen-containing layer 162. As a result, openings 166 are formed in the channel regions of the semiconductor device structure 100, as shown in FIGS. 18A and 18C. The first semiconductor layers 106, the dielectric features 140 may be exposed in the openings 166. Each first semiconductor layer 106 may be a nanostructure channel of the nanosheet transistor.

FIG. 19 is a cross-sectional side view of one of various stages of manufacturing the semiconductor device structure 100, in accordance with some embodiments. As shown in FIG. 19, after the formation of the openings 166, an oxygen-containing layer 168 may be formed around the exposed surfaces of the first semiconductor layer 106 and the substrate portions 103 in the openings 166, followed by forming a gate dielectric layer 170 on the oxygen-containing layer 168 and the dielectric features 140. The oxygen-containing layer 168 may be an oxide layer, and the gate dielectric layer 170 may include the same material as the high-K dielectric layer 138. The oxygen-containing layer 168 and the gate dielectric layer 170 may be formed by any suitable processes, such as ALD processes. In some embodiments, the oxygen-containing layer 168 and the gate dielectric layer 170 are formed by conformal processes.

The gate electrode layer 172 is formed in the openings 166 (FIG. 18A) and on the gate dielectric layer 170. The gate electrode layer 172 is formed on the gate dielectric layer 170 to surround a portion of each first semiconductor layer 106. The gate electrode layer 172 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 172 may be formed by PVD, CVD, ALD, electroplating, or other suitable method. The gate electrode layer 172 may be also deposited over the nitrogen-containing layer 162 (FIG. 18A). The gate electrode layer 172 formed over the nitrogen-containing layer 162 may be removed by using, for example, CMP, until the nitrogen-containing layer 162 is exposed.

The gate electrode layer 172 may be recessed to a level below a top surface of the high-K dielectric layer 138 of the dielectric feature 140, as shown in FIG. 19. Thus, the high-K dielectric layer 138 may be between two gate electrodes layers 172. The recess process may be any suitable process, such as a dry etch, a wet etch, or a combination thereof. In some embodiments, the recess process may be a selective dry etch process that does not substantially affect the nitrogen-containing layer 162, the spacer 152, and the gate dielectric layer 170. As a result of the recess process, some adjacent channel regions may share the gate electrode layer 172, while other adjacent channel regions may include distinct gate electrode layers 172. As mentioned above, if the gate electrode layer 172 is shared by the adjacent channel regions, a single signal (i.e., an electrical current) sent to the gate electrode layer 172 may control both adjacent channel regions. If the gate electrode layers 172 are cut-off, then independent signal (i.e., independent electrical current) may be sent to each gate electrode layer 172 to separately control each of the adjacent channel region. As shown in FIG. 19, the gate electrode layer 172 may be disposed over the dielectric feature 140 without the high-K dielectric layer 138. The portion of the high-K dielectric layer 138 may be removed by the processes described in FIG. 17A for the purpose of sharing the gate electrode layer 172. The height H2 described in FIG. 12A may correspond to the distance between the bottom of the oxygen-containing layer 168 disposed on the substrate portion 103 and the top of the topmost first semiconductor layer 106, as shown in FIG. 19. In some embodiments, the oxygen-containing layer 168 may not be present, and the height H2 described in FIG. 12A may correspond to the distance between the bottom of the gate dielectric layer 170 disposed over the substrate portion 103 and the top of the topmost first semiconductor layer 106.

A dielectric material 174 is formed over the gate electrode layer 172 and the high-K dielectric layer 138, as shown in FIG. 19. The dielectric material 174 may include SiO, HfSi, SiOC, AlO, ZrSi, AlON, ZrO, HfO, TiO, ZrAlO, ZnO, TaO, LaO, YO, TaCN, SiN, SiOCN, ZrN, or SiCN. The dielectric material 174 may be formed by any suitable process, such as PECVD.

Figure 20A:
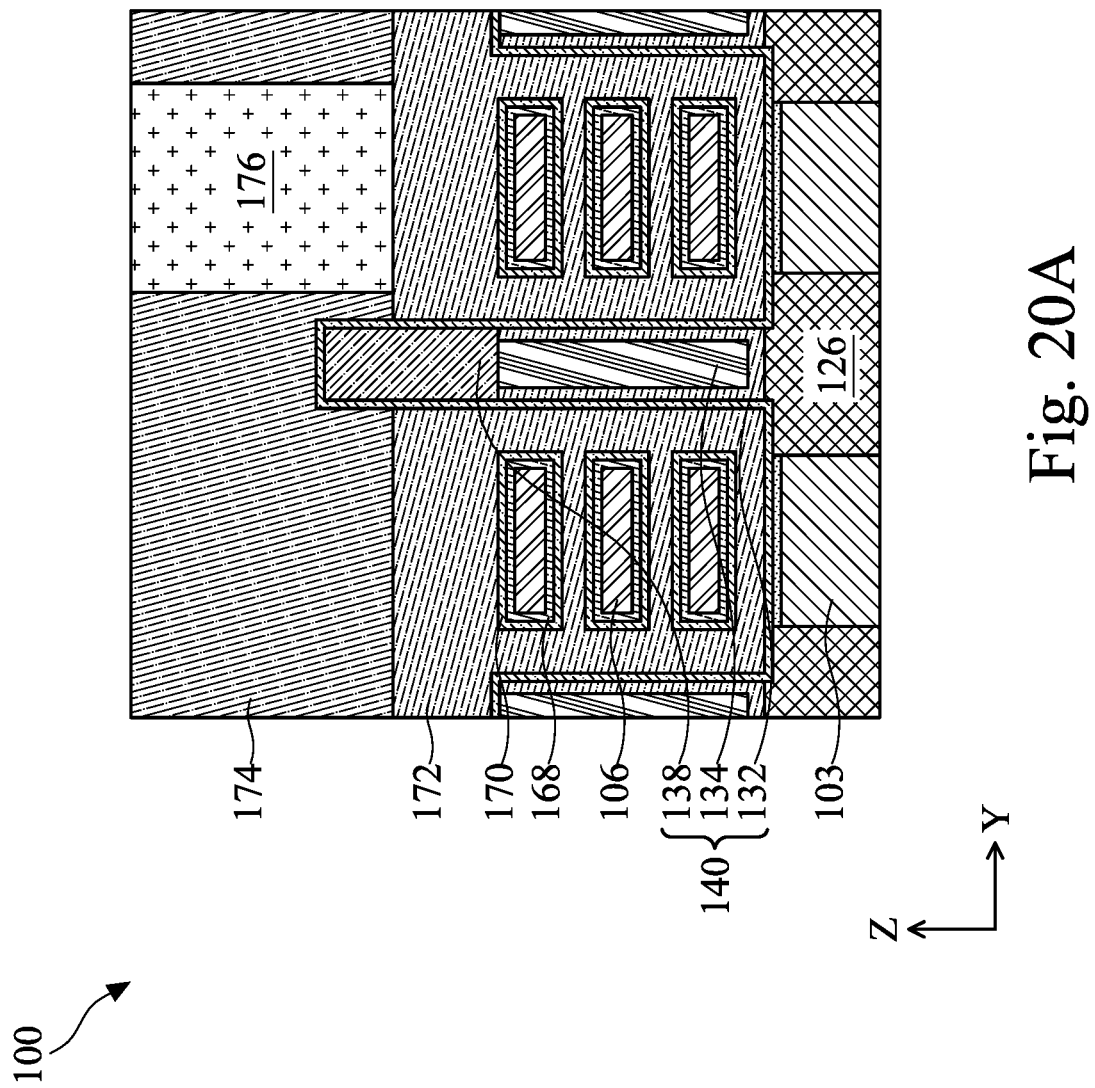
FIGS. 20A-20B are cross-sectional side views of various stages of manufacturing the semiconductor device structure, in accordance with some embodiments.
Figure 20B:
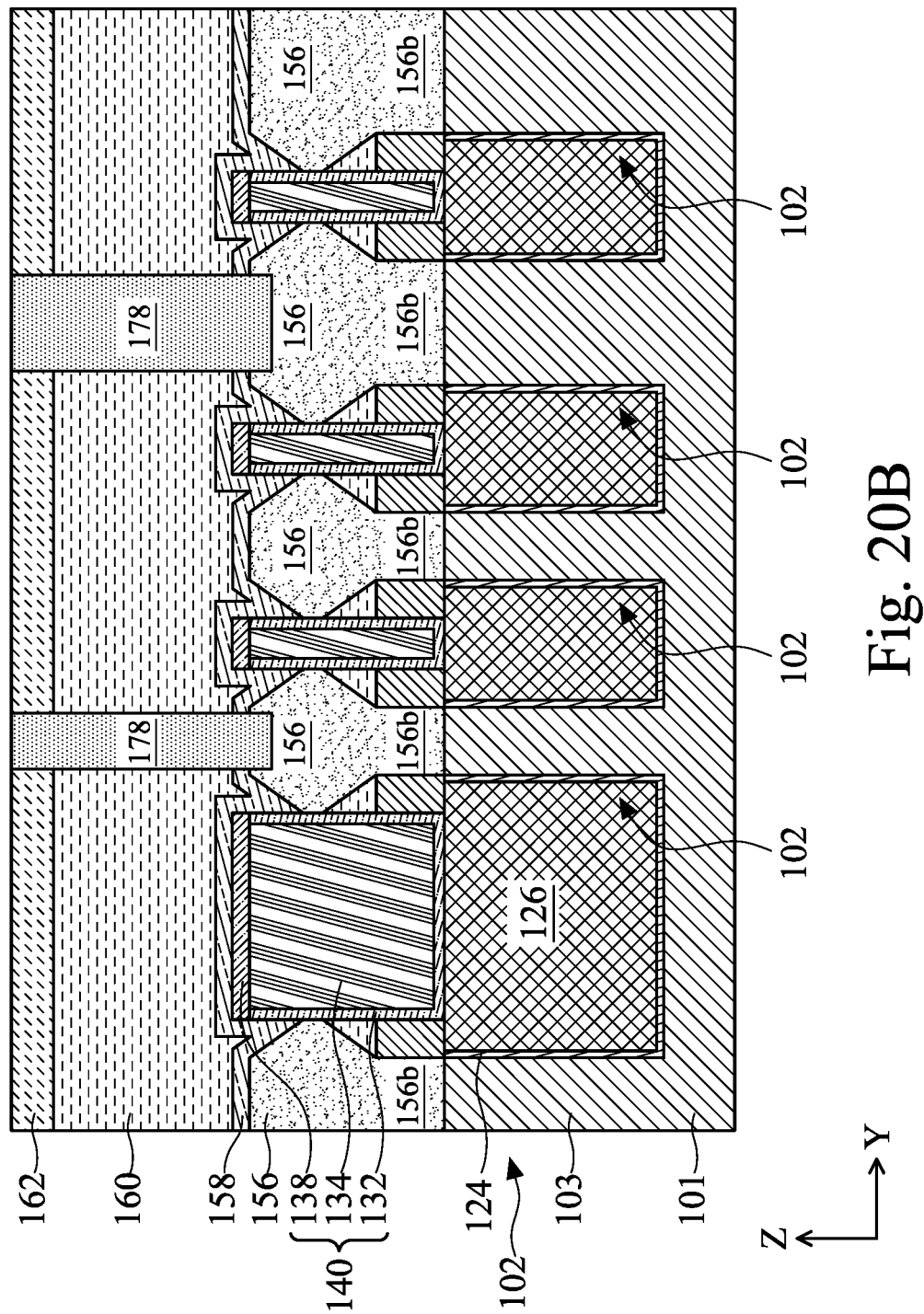

FIGS. 20A-20B are cross-sectional side views of various stages of manufacturing the semiconductor device structure 100, in accordance with some embodiments. As shown in FIG. 20A, a conductive feature 176 may be formed through the dielectric material 174 and in contact with the gate electrode layer 172. The conductive feature 176 may include a material having one or more of Ru, Mo, Co, Ni. W, Ti, Ta, Cu, Al, TiN and TaN. As shown in FIG. 20B, in some embodiments, conductive features 178 may be formed through the ILD layer 160 and the CESL 158 to be in contact with the S/D epitaxial features 156. The conductive features 178 may include the same material as the conductive features 176 and may be formed by the same method as the conductive features 176. In some embodiments, a silicide layer (not shown) is formed on the S/D epitaxial feature 156, and the conductive feature 178 is in contact with the silicide layer.

Figure 21:
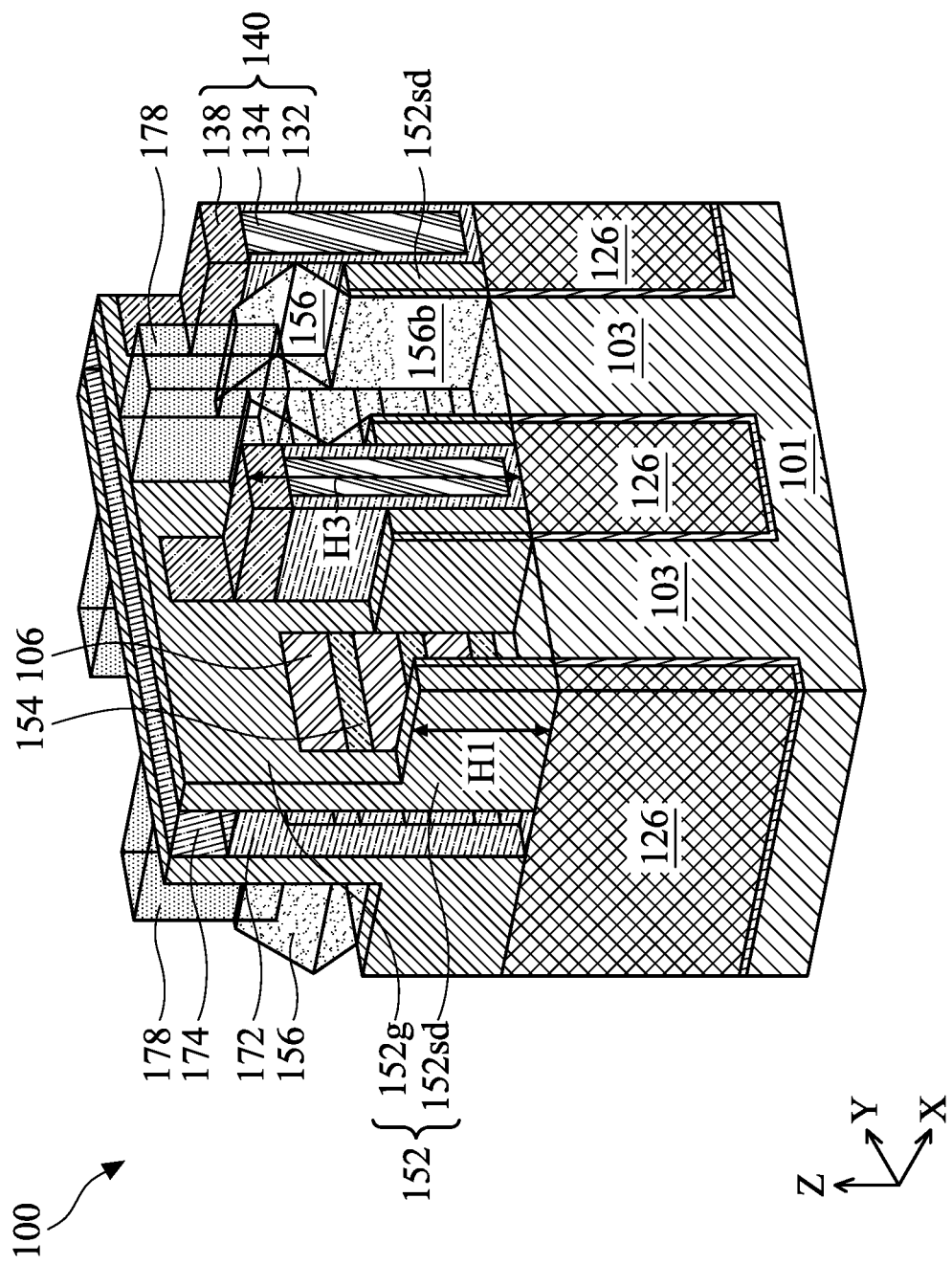
FIG. 21 is a perspective view of one of various stages of manufacturing a semiconductor device structure, in accordance with some embodiments.

FIG. 21 is a perspective view of one of various stages of manufacturing a semiconductor device structure 100, in accordance with some embodiments. Various features are omitted in FIG. 21 for clarity. As shown in FIG. 21, the spacer 152 includes the gate spacer portion 152g and one or more S/D spacer portions 152sd extending from the gate spacer portion 152g. The gate spacer portion 152g and the S/D spacer portions 152sd may be a single piece of material. For example, the spacer 152 having the gate spacer portion 152g and the S/D spacer portions 152sd may be monolithic. In some embodiment, one or more pairs of S/D spacer portions 152sd extend from the gate spacer portion 152g, and a bottom portion 156b of one S/D epitaxial feature 156 is disposed between each pair of S/D spacer portions 152sd. In other words, two S/D spacer portions 152sd clamp the bottom portion 156b of the S/D epitaxial feature 156. In some embodiments, due to the process of forming the spacer 152, the S/D spacer portion 152sd is substantially perpendicular to the gate spacer portion 152g. As shown in FIG. 21, the dielectric feature 140 separating the S/D epitaxial features 156 has a height H3, which is greater than the height H1 of the S/D spacer portion 152sd.

The present disclosure provides a semiconductor device structure 100 including a spacer 152 having a gate spacer portion 152g and S/D spacer portions 152sd. The S/D spacer portions 152sd constrain the size of a bottom portion 156b of a S/D epitaxial features 156. Some embodiments may achieve advantages. For example, the constrained S/D epitaxial features 156 leads to improved total gate capacitance, gate-to-drain capacitance, cell capacitance, and speed at Vdd.

An embodiment is a semiconductor device structure. The structure includes a plurality of semiconductor layers and a first source/drain epitaxial feature in contact with the plurality of semiconductor layers. The first source/drain epitaxial feature includes a bottom portion having substantially straight sidewalls. The structure further includes a spacer having a gate spacer portion and one or more source/drain spacer portions. Each source/drain spacer portion has a first height, and a source/drain spacer portion of the one or more source/drain spacer portions is in contact with one of the substantially straight sidewalls of the first source/drain epitaxial feature. The structure further includes a dielectric feature disposed adjacent one source/drain spacer portion of the one or more source/drain spacer portion. The dielectric has a second height substantially greater than the first height.

Another embodiment is a semiconductor device structure. The structure includes a plurality of semiconductor layers, a gate electrode layer surrounding at least a portion of each of the plurality of semiconductor layers, and a gate dielectric layer. The gate electrode layer is disposed on the gate dielectric layer, and a distance is between a bottom of the gate dielectric layer and a top of a topmost semiconductor layer of the plurality of semiconductor layers. The structure further includes a spacer including a gate spacer portion and one or more source/drain spacer portions, each source/drain spacer portion has a first height, and the first height is about 20 percent to about 75 percent of the distance.

A further embodiment is a method. The method includes forming a fin having a stack of semiconductor layers, an oxide layer disposed on the stack of semiconductor layers, and a semiconductor layer disposed on the oxide layer. The stack of semiconductor layers has a first height. The method further includes forming a cladding layer around the fin, forming a sacrificial gate stack over a portion of the cladding layer and a portion of the semiconductor layer, removing an exposed portion of the cladding layer to form an opening, forming a spacer on sidewalls of the sacrificial gate stack and in the opening, removing an exposed portion of the semiconductor layer to expose a portion of the oxide layer, removing the exposed portion of the oxide layer and a portion of the stack of semiconductor layers disposed under the exposed portion of the oxide layer to expose a substrate portion, and forming a source/drain epitaxial feature on the exposed substrate portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
   forming a fin comprising a stack of semiconductor layers, an oxide layer disposed on the stack of semiconductor layers, and a semiconductor layer disposed on the oxide layer, wherein the stack of semiconductor layers has a first height;
   forming a cladding layer around the fin;
   forming a sacrificial gate stack over a portion of the cladding layer and a portion of the semiconductor layer;
   removing an exposed portion of the cladding layer to form an opening;
   forming a spacer on sidewalls of the sacrificial gate stack and in the opening;
   removing an exposed portion of the semiconductor layer to expose a portion of the oxide layer;
   removing the exposed portion of the oxide layer and a portion of the stack of semiconductor layers disposed under the exposed portion of the oxide layer to expose a substrate portion; and
   forming a source/drain epitaxial feature on the exposed substrate portion.

2. The method of claim 1, further comprising forming a dielectric feature prior to forming the sacrificial gate stack, wherein the opening is between the stack of semiconductor layers and the dielectric feature.

3. The method of claim 1, further comprising recessing a portion of the spacer formed in the opening to a second height, wherein the second height is about 20 percent to about 75 percent of the first height.

4. The method of claim 3, wherein the recessing a portion of the spacer is performed after the removing the portion of the stack of semiconductor layers.

5. The method of claim 3, wherein the forming of the source/drain epitaxial feature is constrained by the recessed portion of the spacer.

6. A method, comprising:
   forming a fin over a substrate;
   forming a cladding layer around the fin;
   forming a dielectric feature in contact with the cladding layer;
   forming a sacrificial gate stack over a portion of the cladding layer, a portion of the dielectric feature, and a portion of the fin;
   removing an exposed portion of the cladding layer to form a gap between an exposed portion of the fin and an exposed portion of the dielectric feature;
   forming a spacer around the sacrificial gate stack, the exposed portion of the dielectric feature, and the exposed portion of the fin, wherein the spacer fills the gap;
   removing a first portion of the spacer formed on the sacrificial gate stack, the dielectric feature, and the fin;
   removing the exposed portion of the fin to expose a substrate portion; and
   forming a source/drain epitaxial feature on the exposed substrate portion.

7. The method of claim 6, wherein the forming the dielectric feature comprises:
   forming a liner over the substrate, wherein the liner is in contact with the cladding layer;
   forming a dielectric material on the liner;
   recessing the liner and the dielectric material; and
   forming a high-K dielectric layer on the dielectric material and the liner.

8. The method of claim 7, wherein a portion of the high-K dielectric layer is removed during the removing the exposed portion of the fin.

9. The method of claim 8, further comprising recessing a second portion of the spacer disposed in the gap.

10. The method of claim 9, wherein the recessing the second portion of the spacer is performed after the removing the exposed portion of the fin.

11. The method of claim 7, wherein the source/drain epitaxial feature is in contact with the spacer and the liner.

12. The method of claim 7, further comprising forming an interlayer dielectric layer over the source/drain epitaxial feature.

13. The method of claim 12, further comprising forming a conductive feature through the interlayer dielectric layer over the source/drain epitaxial feature.

14. A method, comprising:
   forming a fin comprising a stack of alternating first and second semiconductor layers;
   forming a cladding layer around the fin;
   forming a dielectric feature in contact with the cladding layer, wherein a top surface of the cladding layer and a top surface of the dielectric feature are substantially co-planar;
   forming a sacrificial gate stack over a portion of the cladding layer and a portion of the stack of alternating first and second semiconductor layers;
   removing an exposed portion of the cladding layer to form a gap between the dielectric feature and the stack of alternating first and second semiconductor layers;
   forming a spacer on sidewalls of the sacrificial gate stack and in the gap, wherein a portion of the spacer formed in the gap has a height substantially less than a height of the stack of alternating first and second semiconductor layers;
   removing a portion of the stack of alternating first and second semiconductor layers to expose a substrate portion; and
   forming a source/drain epitaxial feature on the exposed substrate portion.

15. The method of claim 14, wherein the forming the dielectric feature comprises:
   forming a liner;
   forming a dielectric material on the liner;
   recessing the liner and the dielectric material; and
   forming a high-K dielectric layer on the dielectric material and the liner.

16. The method of claim 15, wherein the forming the spacer on the sidewalls of the sacrificial gate stack and in the gap comprises:
- depositing a conformal layer around the sacrificial gate stack, the alternating first and second semiconductor layers, and the dielectric feature;
- removing a first portion of the conformal layer disposed over the dielectric feature and the stack of alternating first and second semiconductor layers; and
- recessing a second portion of the conformal layer formed in the gap.

17. The method of claim 16, further comprising removing edge portions of the second semiconductor layers of the stack of alternating first and second semiconductor layers.

18. The method of claim 17, further comprising forming inner spacers in space created by the removing the edge portions of the second semiconductor layers of the stack of alternating first and second semiconductor layers.

19. The method of claim 15, further comprising removing the sacrificial gate stack to expose a portion of the high-K dielectric layer.

20. The method of claim 19, further comprising removing the exposed portion of the high-K dielectric layer.

* * * * *